(12) United States Patent
Okazaki

(10) Patent No.: US 9,853,077 B2
(45) Date of Patent: Dec. 26, 2017

(54) SOLID-STATE IMAGING DEVICE AND ELECTRONIC APPARATUS

(71) Applicant: Sony Corporation, Tokyo (JP)

(72) Inventor: Hiromi Okazaki, Kanagawa (JP)

(73) Assignee: Sony Corporation, Tokyo (JP)

( * ) Notice: Subject to any disclaimer, the term of this patent is extended or adjusted under 35 U.S.C. 154(b) by 0 days.

(21) Appl. No.: 15/449,662

(22) Filed: Mar. 3, 2017

(65) Prior Publication Data

US 2017/0179171 A1 Jun. 22, 2017

Related U.S. Application Data

(63) Continuation of application No. 15/084,912, filed on Mar. 30, 2016, which is a continuation of application No. 14/279,632, filed on May 16, 2014, now Pat. No. 9,570,501.

(30) Foreign Application Priority Data

May 24, 2013 (JP) ................................. 2013-109636

(51) Int. Cl.
 *H01L 27/146* (2006.01)
(52) U.S. Cl.
 CPC .... *H01L 27/1463* (2013.01); *H01L 27/14621* (2013.01); *H01L 27/14623* (2013.01); *H01L 27/14627* (2013.01); *H01L 27/14636* (2013.01); *H01L 27/14645* (2013.01)
(58) Field of Classification Search
 CPC ........... H01L 27/14621; H01L 27/1463; H01L 27/14623; H01L 27/14627; H01L 27/14636; H01L 27/14645; H01L 31/0232
 See application file for complete search history.

(56) References Cited

U.S. PATENT DOCUMENTS

| | | | | |
|---|---|---|---|---|
| 9,209,320 | B1* | 12/2015 | Webster | ............ H01L 31/02027 |
| 2007/0284687 | A1* | 12/2007 | Rantala | ............. H01L 21/02126 |
| | | | | 257/432 |
| 2010/0244167 | A1* | 9/2010 | Konno | .............. H01L 27/14625 |
| | | | | 257/432 |

(Continued)

FOREIGN PATENT DOCUMENTS

| | | |
|---|---|---|
| JP | 2005-005472 | 1/2005 |
| JP | 2005-117008 | 4/2005 |

(Continued)

OTHER PUBLICATIONS

Official Action (with English translation) for Japanese Patent Application No. 2016-211987 dated Jul. 11, 2017, 20 pages.

*Primary Examiner* — Nathan W Ha
(74) *Attorney, Agent, or Firm* — Sheridan Ross P.C.

(57) ABSTRACT

A solid-state imaging device includes a semiconductor layer on which a plurality of pixels are arranged along a light-receiving surface being a main surface of the semiconductor layer, photoelectric conversion units provided for the respective pixels in the semiconductor layer, and a trench element isolation area formed by providing an insulating layer in a trench pattern formed on a light-receiving surface side of the semiconductor layer, the trench element isolation area being provided at a position displaced from a pixel boundary between the pixels.

30 Claims, 14 Drawing Sheets

(56) References Cited

U.S. PATENT DOCUMENTS

| | | | | |
|---|---|---|---|---|
| 2011/0019050 A1* | 1/2011 | Yamashita | ........... | H01L 27/1463 348/308 |
| 2011/0156186 A1* | 6/2011 | Iida | ............... | H01L 27/1463 257/432 |
| 2011/0242350 A1* | 10/2011 | Sawayama | ......... | H01L 27/14625 348/222.1 |
| 2012/0075509 A1* | 3/2012 | Ito | ............... | H01L 27/14621 348/265 |
| 2012/0153128 A1* | 6/2012 | Roy | ............... | H01L 27/14609 250/208.1 |
| 2012/0217602 A1* | 8/2012 | Enomoto | .......... | H01L 27/14614 257/432 |
| 2012/0235263 A1* | 9/2012 | Ogita | ............... | H01L 27/14621 257/432 |
| 2013/0075591 A1* | 3/2013 | Otake | ............... | H01L 27/14623 250/208.1 |
| 2013/0176396 A1* | 7/2013 | Cohen | ............... | H01L 27/1461 348/46 |
| 2013/0320479 A1* | 12/2013 | Ahn | ............... | H01L 31/02 257/460 |

FOREIGN PATENT DOCUMENTS

| | | |
|---|---|---|
| JP | 2008-294218 | 12/2008 |
| JP | 2009-088030 | 4/2009 |
| JP | 2009-164385 | 7/2009 |
| JP | 2010-129548 | 6/2010 |
| JP | 2010-199668 | 9/2010 |
| JP | 2010-225939 | 10/2010 |
| JP | 2010-245100 | 10/2010 |
| JP | 2011-103359 | 5/2011 |
| JP | 2011-138905 | 7/2011 |
| JP | 2011-216623 | 10/2011 |
| JP | 2012-028459 | 2/2012 |
| JP | 2012-129358 | 7/2012 |
| JP | 2012-169530 | 9/2012 |
| JP | 2012-178457 | 9/2012 |
| WO | WO 2011/148574 | 12/2011 |
| WO | WO 2012/117931 | 9/2012 |

\* cited by examiner

SOLID-STATE IMAGING DEVICE AND ELECTRONIC APPARATUS

CROSS REFERENCE TO RELATED APPLICATIONS

This application is a continuation of U.S. patent application Ser. No. 15/084,912, filed Mar. 30, 2016, which is a continuation of U.S. patent application Ser. No. 14/279,632, filed May 16, 2014, now U.S. Pat. No. 9,570,501, which claims the benefit of Japanese Patent Application JP 2013-109636, filed May 24, 2013, the entire disclosures of which are hereby incorporated herein by reference.

BACKGROUND

The present disclosure relates to a solid-state imaging device and an electronic apparatus, and particularly to a solid-state imaging device including a trench element separation area and an electronic apparatus including the solid-state imaging device.

A solid-state imaging device includes a plurality of pixels arranged along a light-receiving surface side of a semiconductor substrate. The respective pixels include a photoelectric conversion unit provided in the semiconductor substrate, and a color filter and an on-chip lens provided on the upper side of the semiconductor substrate.

In the solid-state imaging device having such a configuration, if light that has obliquely entered a light-receiving surface leaks to a photoelectric conversion unit of an adjacent pixel, the light leakage becomes a factor to cause color mixture and color shading.

In this regard, a configuration in which trench element isolation areas that separate the photoelectric conversion units of the pixels are formed in the semiconductor substrate on the light-receiving surface side, and a light-shielding film is provided in the respective trench element isolation areas to prevent light leakage from occurring between adjacent pixels, has been proposed. In such a configuration, the width of an opening of the trench is narrowed at a shallow position on the light-receiving surface side, and a light-shielding film is embedded only in the trench at the shallow position. Accordingly, it is possible to form a light-shielding film without generating a void, and to block light between the pixels effectively (see, for example, Japanese Patent Application Laid-open No. 2012-178457).

SUMMARY

Even in a solid-state imaging device having a configuration in which a trench element isolation area is provided in a semiconductor substrate, however, the collapse of color balance occurs that depends on a wavelength of received light and an incidence angle of the received light, which is a factor to cause coloring.

In this regard, it is desirable to provide a solid-state imaging device having favorable color balance without coloring, and an electronic apparatus using the solid-state imaging device.

According to an embodiment of the present disclosure, there is provided a solid-state imaging device including a semiconductor layer on which a plurality of pixels are arranged along a light-receiving surface being a main surface of the semiconductor layer, photoelectric conversion units provided for the respective pixels in the semiconductor layer, and a trench element isolation area formed by providing an insulating layer in a trench pattern formed on a light-receiving surface side of the semiconductor layer, the trench element isolation area being provided at a position displaced from a pixel boundary between the pixels.

In the solid-state imaging device having such a configuration, a trench element isolation area is located at a position displaced from the boundary of the pixels. Therefore, by making the direction in which the trench element isolation area is displaced a direction that depends on a wavelength of received light in the respective pixels, the volume and position of the photoelectric conversion unit on the light-receiving surface side on which the trench element isolation area is provided can be caused to depend on the wavelength of the received light. Accordingly, it is possible to improve the color balance between light of a short-wavelength photoelectrically converted in an area on the light-receiving surface in which the trench element isolation area is provided, and light of a long-wavelength photoelectrically converted in an area that is deeper than the area.

As a result, according to the present disclosure, it is possible to capture an image with favorable color balance without coloring, and to improve the imaging properties.

These and other objects, features and advantages of the present disclosure will become more apparent in light of the following detailed description of best mode embodiments thereof, as illustrated in the accompanying drawings.

DETAILED DESCRIPTION OF EMBODIMENTS

Hereinafter, embodiments of the present disclosure will be described with reference to the drawings in the following order.
1. Schematic Configuration Example of Solid-State Imaging Device According to Embodiment
2. First Embodiment (First Example in which Position of Trench Element Isolation Area is Displaced to Side of Pixel of Long-wavelength)
3. Second Embodiment (Second Example in which Position of Trench Element Isolation Area is Displaced to Side of Pixel of Long-wavelength)
4. Third Embodiment (Third Example in which Position of Trench Element Isolation Area is Displaced to Side of Pixel of Long-wavelength)
5. Fourth Embodiment (Fourth Example in which Position of Trench Element Isolation Area is Displaced to Side of Pixel of Long-wavelength)
6. Fifth Embodiment (Example in which Position of Trench Element Isolation Area is Displaced to Side of Pixel of Short-wavelength)
7. Sixth Embodiment (Electronic Apparatus Using Solid-state Imaging Device)
(1. Schematic Configuration Example of Solid-state Imaging Device According to Embodiment)

Figure 1:
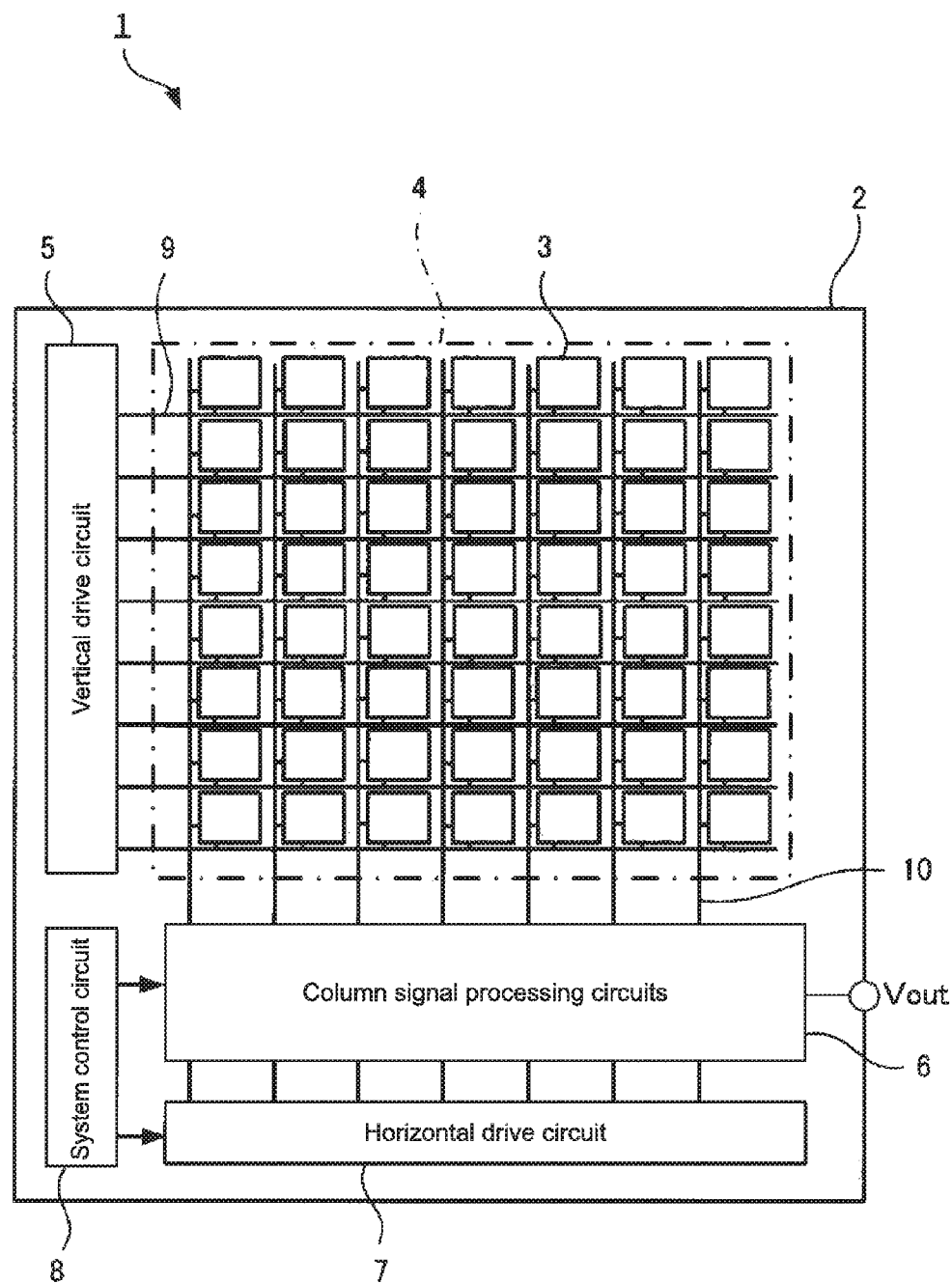
FIG. 1 is a schematic configuration diagram showing an exemplary solid-state imaging device to which an embodiment of the present disclosure is applied.

FIG. 1 shows the schematic configuration of an MOS (Metal Oxide Semiconductor)-type solid-state imaging device, as an exemplary solid-state imaging device according to an embodiment of the present disclosure.

A solid-state imaging device 1 shown in FIG. 1 has a pixel area 4 in which a plurality of pixels 3 including photoelectric conversion areas are two-dimensionally arranged on a surface of a supporting substrate 2. To the respective pixels 3 arranged in the pixel area 4, a pixel circuit including a photoelectric conversion area, a floating diffusion, a reading gate, a plurality of transistors (so-called MOS transistors), and a capacitive element is provided. It should be noted that the plurality of pixels 3 may share a part of the pixel circuit.

In the peripheral portion of the pixel area 4, peripheral circuits such as a vertical drive circuit 5, column signal processing circuit 6, a horizontal drive circuit 7, and a system control circuit 8 are provided.

The vertical drive circuit 5 includes a shift register, for example, selects a pixel drive line 9, supplies a pulse for driving the pixels 3 to the selected pixel drive line 9, and drives the pixels 3 arranged in the pixel area 4 row by row. Specifically, the vertical drive circuit 5 selectively scans the pixels 3 arranged in the pixel area 4 row by row in a vertical direction successively. Then, through vertical drive lines 10 disposed vertically to the pixel drive lines 9, the vertical drive circuit 5 supplies a pixel signal based on a signal charge generated depending on the amount of received light in the respective pixels 3 to the column signal processing circuit 6.

The column signal processing circuit 6 is arranged to correspond to, for example, columns of the pixels 3, and perform signal processing such as removing noise of a signal output from the pixels 3 in one row for each pixel column. Specifically, the column signal processing circuit 6 performs signal processing such as correlated double sampling (CDS) for removing unique fixed pattern noise of a pixel, signal amplification, and analog/digital (AD) conversion.

The horizontal drive circuit 7 includes, for example, a shift register, selects a destination of the column signal processing circuit 6 by sequentially outputting a horizontal scanning pulse, and causes the column signal processing circuit 6 to output a pixel signal.

The system control circuit 8 receives an input clock and data for instructing an operation mode or the like, and outputs data such as internal information of the solid-state imaging device 1. Specifically, the system control circuit 8 generates a clock signal or control signal that is a reference of the behavior of the vertical drive circuit 5, the column signal processing circuit 6, the horizontal drive circuit 7, and the like, based on a vertical synchronous signal, a horizontal synchronous signal, and a master clock. Then, the system control circuit 8 inputs these signals to the vertical drive circuit 5, the column signal processing circuit 6, the horizontal drive circuit 7, and the like.

The peripheral circuits 5 to 8 and a pixel circuit provided in the pixel area 4 constitute a drive circuit that drives the respective pixels 3. It should be noted that the peripheral circuits 5 to 8 may be arranged to be laminated on the pixel area 4.
(2. First Embodiment (First Example in which Position of Trench Element Isolation Area is Displaced to Side of Pixel of Long-wavelength)

In a first embodiment of the present disclosure, a description will be made in the order of the configuration a solid-state imaging device 1-1 according to the first embodiment, a method of producing the solid-state imaging device 1-1, and effects of the first embodiment.
(Configuration of Solid-state Imaging Device 1-1)

Figure 2:
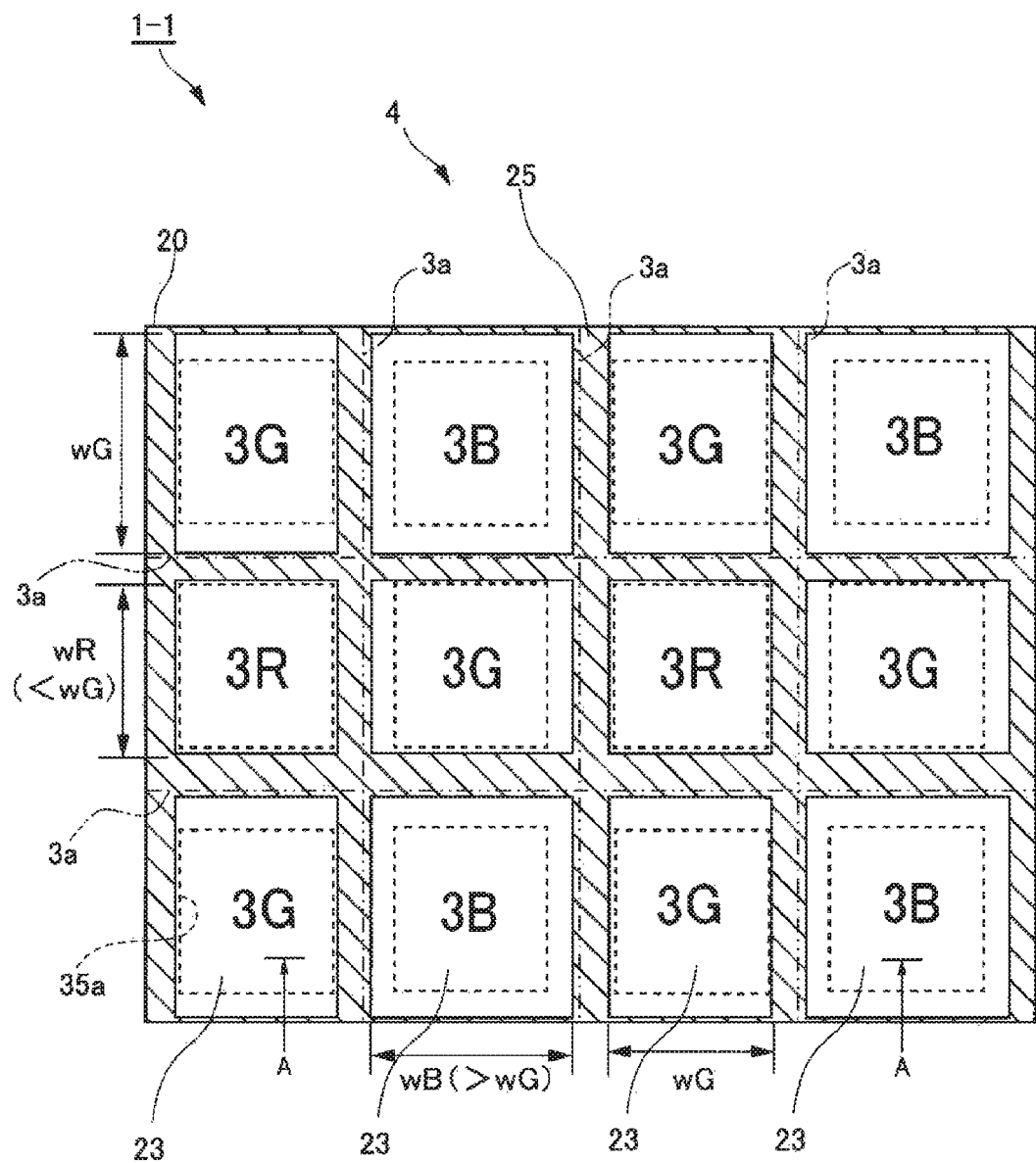
FIG. 2 is a plan view of a main portion of a solid-state imaging device according to a first embodiment of the present disclosure.
Figure 3:
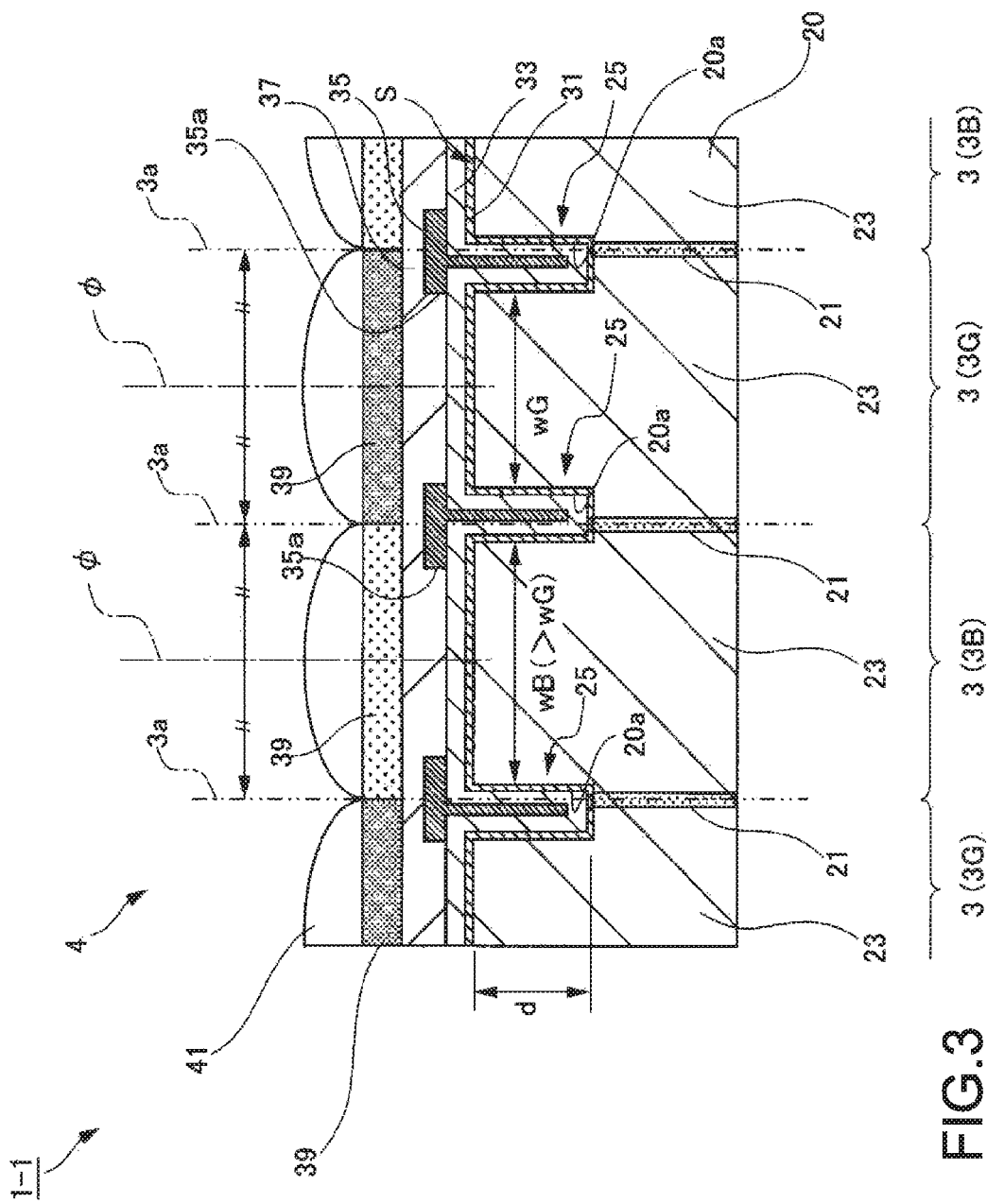
FIG. 3 is a cross-sectional view of a main portion of the solid-state imaging device according to the first embodiment, which corresponds to the cross-section taken along the line A-A of FIG. 2.

FIG. 2 is a plan view of a main portion of the solid-state imaging device 1-1 according to the first embodiment, and shows 12 pixels in the case where a semiconductor layer 20 in the pixel area 4 is viewed from a light-receiving surface side in a plan view. FIG. 3 is a cross-sectional view of a main portion of the solid-state imaging device 1-1 according to the first embodiment, which corresponds to the cross-section taken along the line A-A of FIG. 2. Hereinafter, the configuration of the solid-state imaging device 1-1 according to the first embodiment will be described based on FIGS. 2 and 3.

The solid-state imaging device 1-1 according to the first embodiment includes the semiconductor layer 20 bonded to a supporting substrate whose illustration is omitted here, and is a rear-surface irradiation type imaging device in which a transistor or a wiring layer whose illustration is omitted here is provided on a side opposite to a light-receiving surface S that is a main surface of the semiconductor layer 20.

In the semiconductor layer 20, division areas 21 in which impurities are diffused are provided. In the respective pixels 3 divided by the division areas 21, a photoelectric conversion unit 23 is provided. Moreover, on the side of the light-receiving surface S of the semiconductor layer 20, trench element isolation areas 25 characteristically arranged in this embodiment are provided. In addition, on the light-receiving surface S of the semiconductor layer 20, a protective insulating layer 31, an insulating layer 33, and a light-shielding film 35 are provided in the stated order, and color filters 39 and on-chip lenses 41 are laminated via a planarization insulating film 37.

Hereinafter, the configuration of the semiconductor layer 20, the trench element isolation areas 25 provided in the semiconductor layer 20, and the layers laminated on the light-receiving surface S of the semiconductor layer 20 will be described.

(Semiconductor Layer 20)

The semiconductor layer 20 includes n-type single crystal or polycrystalline silicon, and is formed by making the thickness of a semiconductor substrate formed of n-type single crystal silicon thin, for example. A main surface side of the semiconductor layer 20 is the light-receiving surface S, and the plurality of pixels 3 are arranged along the light-receiving surface S. The respective pixels 3 are arranged as a red pixel 3R that receives red light, a green pixel 3G that receives green light, or a blue pixel 3B that receives blue light. Here, as an example, the case where the pixels of the colors 3 are two-dimensionally arranged in a Bayer pattern is shown.

The pixels of the colors 3R, 3G, and 3B arranged in a Bayer pattern are arranged in the same shape with respect to the light-receiving surface S regardless of the wavelength of received light. Assuming that the boundary between one pixel 3 and the other pixel 3 is a pixel boundary 3a, for example, the respective pixels 3 surrounded by the pixel boundaries 3a in the light-receiving surface S have a substantially square flat shape with a uniform size.

In such a semiconductor layer 20, the division areas 21 formed as diffusion areas of p-type impurities are provided. The respective division areas 21 extend from a surface opposite to the light-receiving surface S to the light-receiving surface S along the pixel boundaries 3a in the semiconductor layer 20 with the respective pixel boundaries 3a being a center.

In addition, in the semiconductor layer 20, the n-type photoelectric conversion unit 23 is provided for the respective pixels 3. The respective n-type photoelectric conversion units 23 include an n-type area divided by the division area 21 and the trench element isolation area 25 to be described later, in the semiconductor layer 20. The photoelectric conversion unit 23 and the p-type division area 21 constitute a photodiode, and the photoelectric conversion unit 23 is a storing area of charges photoelectrically converted in the respective pixels 3.

It should be noted that although various impurity areas such as a surface diffusion layer and a source/drain of a transistor that is arranged in a normal rear-surface irradiation type solid-state imaging device and a surface diffusion layer are provided in addition to the division areas 21 and the photoelectric conversion units 23 in the semiconductor layer 20, illustration and description thereof will be omitted here.

(Trench Element Isolation Areas 25)

The respective trench element isolation areas 25 are formed by providing the protective insulating layer 31 and the insulating layer 33 in a groove pattern 20a provided on the side of the light-receiving surface S of semiconductor layer 20, and providing the light-shielding film 35 via the protective insulating layer 31 and the insulating layer 33. The trench element isolation area 25 having such a configuration is characteristically provided at a position displaced from the center of the pixel boundary 3a on the light-receiving surface S. The direction in which the trench element isolation area 25 is displaced from the pixel boundary 3a depends on the wavelength of received light in two pixels 3 divided by the trench element isolation area 25.

In particular, in the first embodiment, the trench element isolation area 25 is provided to be displaced in a direction of a pixel out of two pixels 3 arranged adjacent thereto, which receives light of a longer wavelength. Specifically, in the configuration in which the pixels of the colors 3R, 3G, and 3B are arranged in a Bayer pattern, the trench element isolation area 25 between the green pixel 3G and the blue pixel 3B is provided at a position displaced toward the side of the green pixel 3G. On the other hand, the trench element isolation area 25 between the green pixel 3G and the red pixel 3R is provided at a position displaced toward the side of the red pixel 3R.

It should be noted that "the trench element isolation areas 25 is provided at a position displaced from the center of the pixel boundary 3a" represents that the center of the width direction of the trench element isolation area 25 when viewed from the side of the light-receiving surface S, i.e., the center of the opening width of the groove pattern 20a is displaced from the pixel boundary 3a. Therefore, the trench element isolation area 25 may be provided on the pixel boundary 3a.

In such a configuration, the width of the trench element isolation areas 25 when viewed from the side of the light-receiving surface S, i.e., the opening width of the groove pattern 20a may be constant in the light-receiving surface S.

Accordingly, in the semiconductor layer 20, in a depth area in which the trench element isolation area 25 is provided, the width of the photoelectric conversion unit 23 in the arrangement direction of the pixels of the colors 3R, 3G, and 3B is larger in one pixel that receives light of a longer wavelength. For example, in a direction in which the green pixel 3G and the blue pixel 3B are adjacent thereto, a width wG of the photoelectric conversion unit 23 in the green pixel 3G is smaller than a width wB of the photoelectric conversion unit 23 in the blue pixel 3B in a depth area in which the trench element isolation area 25 is provided. On the other hand, in a direction in which the green pixel 3G and the red pixel 3R are adjacent thereto, the width wG of the photoelectric conversion unit 23 in the green pixel 3G is larger than a width wR of the photoelectric conversion unit 23 in the red pixel 3R in a depth area in which the trench element isolation areas 25 is provided.

Therefore, in an area in which the trench element isolation area 25 is provided, i.e., an area in which light of a short-wavelength is photoelectrically converted being a surface area close to the light-receiving surface S, the volume of the photoelectric conversion unit 23 in the pixels of the colors 3R, 3G, and 3B is larger in one pixel that receives light of a shorter wavelength.

On the other hand, in the semiconductor layer 20, the width of the photoelectric conversion unit 23 in the pixels of the colors 3R, 3G, and 3B is substantially constant in the arrangement direction of the pixels in a depth area in which the trench element isolation area 25 is not provided, i.e., an area in which light of a long-wavelength is photoelectrically converted being an area distant from the light-receiving surface S. Therefore, the volume of the photoelectric conversion unit 23 in the pixels of the colors 3R, 3G, and 3B is uniform.

Figure 4:
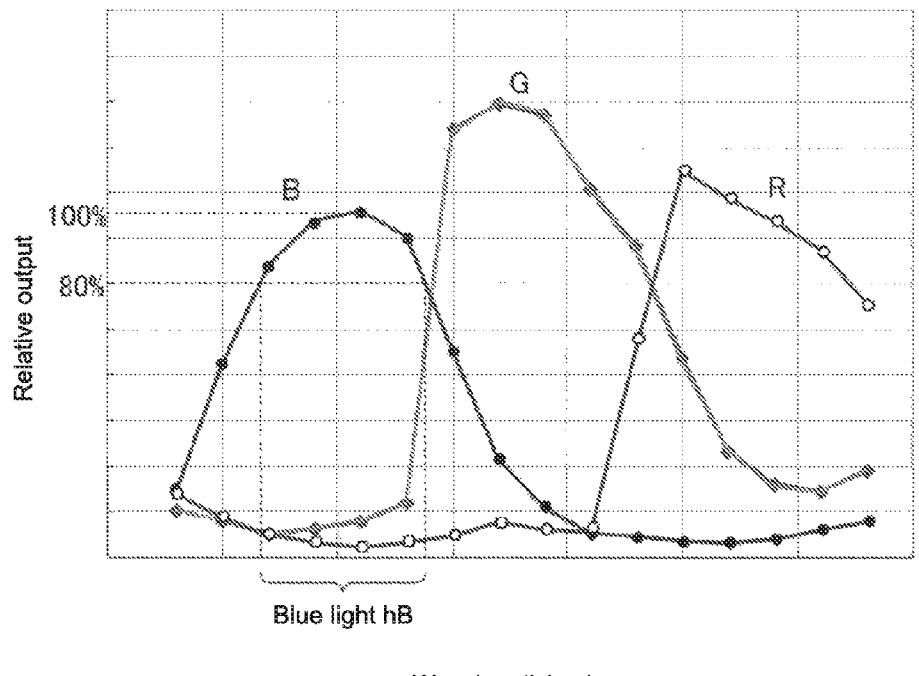
FIG. 4 is a graph showing relative output with respect to light of colors received in a photoelectric conversion unit.

Moreover, a depth d of the trench element isolation area 25 from the light-receiving surface S may be any depth as long as light of the shortest-wavelength of received light of wavelengths in the respective pixels 3 can be fully absorbed. For example, FIG. 4 is a graph showing relative output with respect to a wavelength of light that passes through a color filter of the respective colors to be described later and is received in the respective photoelectric conversion unit. As shown in the graph, the wavelength range in which 80% of light of each wavelength received in the photoelectric conversion unit is converted in the photoelectric conversion unit and is output is set as the wavelength range of light of the respective colors to be received. Accordingly, the wavelength range of blue light hB is defined. Then, as shown in FIG. 5, a depth D (here, D=2300 nm) from the light-receiving surface S in which the blue light hB in the defined wavelength range is almost fully absorbed is a maximum value, and the depth d of the trench element isolation area is set within the range of the depth D.

Figure 5:
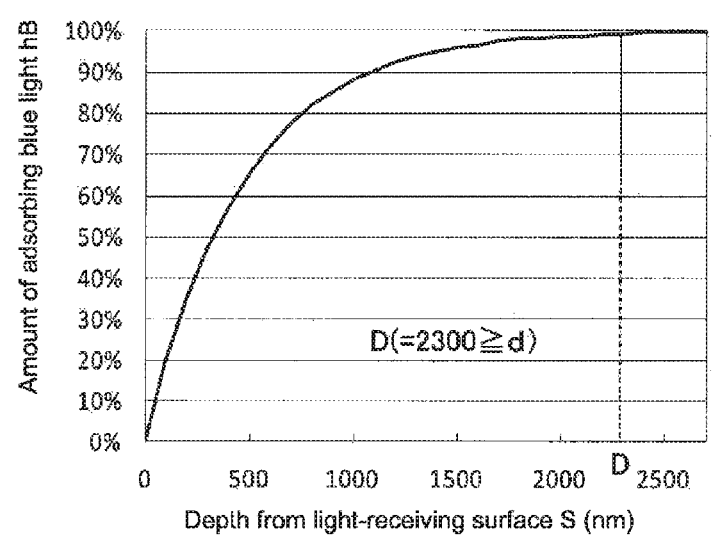
FIG. 5 is a graph showing the amount of absorbing blue light with respect to the depth from a light-receiving surface of a semiconductor layer (Si)

For example, FIG. 5 shows the amount of absorbing the blue light hB in the case where the semiconductor layer 20 includes single crystalline silicon. In this case, at a depth of about 2300 nm from the light-receiving surface S, the blue light hB can be almost fully absorbed. Therefore, the depth d of the trench element isolation area 25 is set to not more than D being 2300 nm.

In the trench element isolation area 25 arranged as described above, the protective insulating layer 31 and the insulating layer 33 provided on the light-receiving surface S of the semiconductor layer 20 cover the inner wall of the groove pattern 20a. Furthermore, above the center of the groove pattern 20a, the light-shielding film 35 is embedded via the protective insulating layer 31 and the insulating layer 33.

The protective insulating layer 31 includes a metal oxide that stores negative charges, and forms a hole accumulation layer on the interface of the semiconductor layer 20. Such a protective insulating layer 31 includes an oxide such as hafnium (Hf), aluminum (Al), tantalum (Ta), and titanium (Ti). On the other hand, the insulating layer 33 includes silicon oxide ($SiO_2$) or silicon nitride (SiN).

(Light-Shielding Film 35)

The light-shielding film 35 is pattern-formed above the light-receiving surface S via the protective insulating layer 31 and the insulating layer 33. The light-shielding film 35 is embedded in the groove pattern 20a of the trench element isolation area 25 to form a part of the trench element isolation area 25. In addition, above the light-receiving surface S, the light-shielding film 35 is patterned to have an opening 35a above the photoelectric conversion unit 23. The opening 35a may have the same shape in the pixels of the colors 3R, 3G, and 3B, and the center of the opening 35a corresponds to a pixel center $\phi$.

In addition, the light-shielding film 35 is pattern-formed above the light-receiving surface S to have a line width with the pixel boundary 3a being a center. The line width may be constant, and the center of the line width may correspond to the pixel boundary 3a. For example, the light-shielding film 35 has a line width that covers the trench element isolation area 25 when viewed from the side of the light-receiving surface S in a plan view.

Such a light-shielding film 35 includes a metal material having light-shielding properties such as tungsten (W), aluminum (Al), titanium nitride (TiN), and titanium (Ti).

In addition, the light-shielding film 35 patterned as described above is covered by the planarization insulating film 37.

(Color Filter 39)

The color filters 39 are a layer provided on the planarization insulating film 37, and each include a color filter of each color patterned for the respective pixels 3. The patterned color filter 39 is configured to cause light within a wavelength range to be received in the respective pixels 3R, 3G, and 3B to transmit therethrough. The color filters 39 may have the same shape in the pixels of the colors 3R, 3G, and 3B, and the center of the respective color filters 39 may correspond to the pixel center $\phi$.

(On-chip Lens 41)

The on-chip lenses 41 are arranged for the respective pixels 3 on the color filters 39, and each are a convex lens being convex with respect to an incidence direction of light, for example, here. Favorably, such on-chip lenses 41 have the same shape in the pixels of the colors 3R, 3G, and 3B, and the center of the respective on-chip lenses 41 corresponds to the pixel center $\phi$.

(Method of Producing Solid-state Imaging Device 1-1)

FIG. 6 are each a cross-sectional process diagram showing the procedure of producing the solid-state imaging device according to the first embodiment. Hereinafter, with reference to FIG. 6, a method of producing the solid-state imaging device according to the first embodiment shown in FIG. 2 and FIG. 3 will be described.

(FIG. 6A)

Figure 6A:
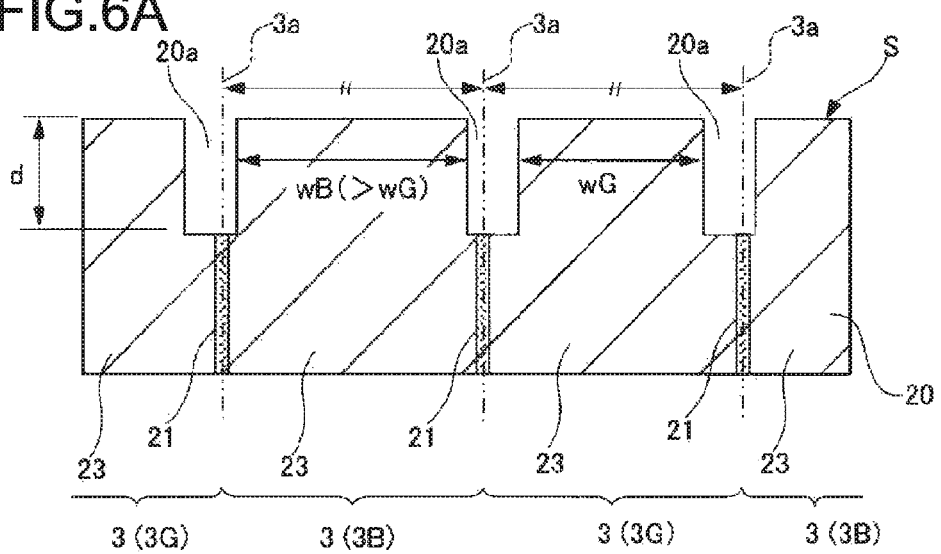
FIGS. 6A-6C are each a manufacturing process diagram of the solid-state imaging device according to the first embodiment.
Figure 6B:
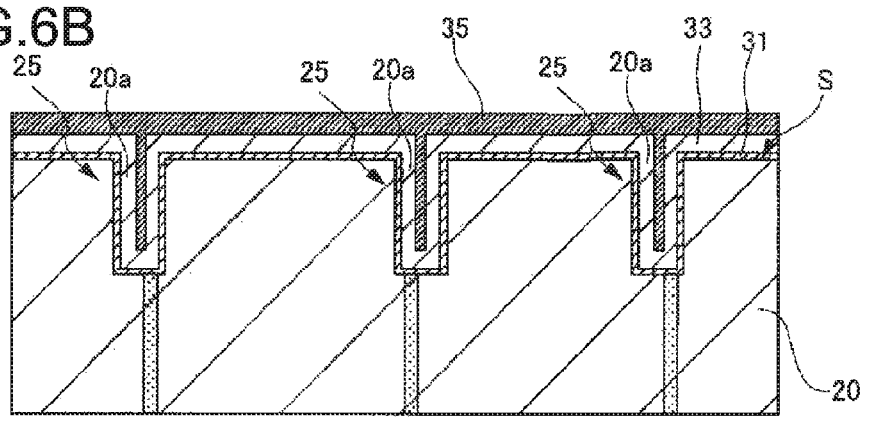
Figure 6C:
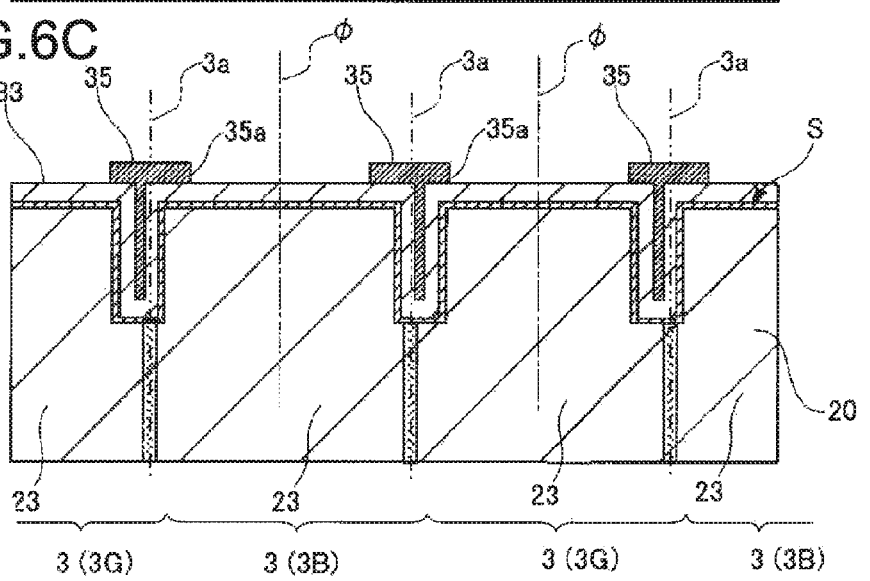

As shown in FIG. 6A-6C, in the semiconductor layer 20 including, for example, n-type single crystalline silicon, the p-type division areas 21 are formed by the diffusion of impurities from a surface opposite to the light-receiving surface S first. The respective division areas 21 are formed to have a certain width with the boundary between the pixels 3 two-dimensionally arranged equally on the light-receiving surface S of the semiconductor layer 20 (pixel boundary 3a) being a center.

Moreover, although illustration is omitted here, an impurity diffusion layer is formed in the semiconductor layer 20 as necessary, a wiring layer is formed on a surface opposite to the light-receiving surface S of the semiconductor layer 20, the wiring layer is covered by an insulating film, and a supporting substrate is bonded thereto. After that, the semiconductor layer 20 is polished from the side of the light-receiving surface S to obtain a desired film thickness.

Next, on the side of the light-receiving surface S of the semiconductor layer 20, the groove patterns 20a are formed. The respective groove patterns 20a are formed to have the depth d that extends from the light-receiving surface S to the division area 21 along the pixel boundary 3a at a position displaced from the center of the pixel boundary 3a in a width direction. The displacement of the groove pattern 20a with respect to the pixel boundary 3a and the depth d are the same as those of the trench element isolation area described with reference to FIG. 3 previously. Such a groove pattern 20a is formed by applying a lithography technique to form a mask pattern on the light-receiving surface S, and etching the semiconductor layer 20 with the mask pattern.

Accordingly, the semiconductor layer 20 including n-type single crystalline silicon is divided by the p-type division areas 21 and the groove pattern 20a, and respective portions obtained by the division are the n-type photoelectric conversion unit 23. The width and the volume in the arrangement direction of the pixels of the colors 3R, 3G, and 3B of the photoelectric conversion unit 23 in the respective pixels 3 are larger in a pixel that receives light of a shorter wavelength in a depth area in which the groove pattern 20a is provided, i.e., surface area close to the light-receiving surface S. On the other hand, in a depth area in which the groove pattern 20a is not provided, i.e., area distant from the light-receiving surface S, the width and the volume of the photoelectric conversion unit 23 in the pixels of the colors 3R, 3G, and 3B are uniform.

(FIG. 6B)

Next, as shown in FIG. 6B, the protective insulating layer 31 and the insulating layer 33 are deposited in the stated order on the light-receiving surface S of the semiconductor layer 20 so as to cover the inner wall of the groove pattern 20a. At this time, the protective insulating layer 31 including a metal oxide is deposited with an atomic layer deposition (ALD) method, for example.

Next, the insulating layer 33 including silicon oxide or silicon nitride is deposited with a plasma-enhanced chemical vapor deposition (CVD) method. Here, the protective insulating layer 31 and the insulating layer 33 are formed with a film thickness such that the groove pattern 20a is not embedded.

After that, the insulating layer 33 and the light-shielding film 35 are deposited with a sufficient film thickness such that the inside of the groove pattern 20a is embedded and light is blocked. At this time, the light-shielding film 35 including a metal material is deposited with a sputtering method, for example.

In this way, the trench element isolation areas 25 are obtained by embedding the protective insulating layer 31, the insulating layer 33, and the light-shielding film 35 in the groove pattern 20a formed in the semiconductor layer 20. (FIG. 6C)

Next, as shown in FIG. 6C, the light-shielding film 35 is patterned on the insulating layer 33, and the opening 35a are formed above the photoelectric conversion unit 23. At this time, the opening 35a may have the same shape in the respective pixels of the colors 3R, 3G, and 3B, and the center of the opening 35a corresponds to the pixel center φ. In addition, the light-shielding film 35 is patterned such that the center of the line width of the light-shielding film 35 corresponds to the center of the pixel boundary 3a in the state where the opening 35a is formed and the trench element isolation areas 25 are covered by the light-shielding film 35 when viewed from the side of the light-receiving surface S in a plan view. (FIG. 3)

After that, as shown in FIG. 3, the planarization insulating film 37 is formed above the insulating layer 33 so as to cover the patterned light-shielding film 35.

Next, the color filters of the colors 39 are pattern-formed for the pixels 3 on the planarization insulating film 37, and the on-chip lenses 41 are pattern-formed on the color filters 39. As described above, the color filters 39 and the on-chip lenses 41 may have the same shape in the pixels of the colors 3R, 3G, and 3B, and the center of the respective color filters 39 and the respective on-chip lenses 41 correspond to the pixel center φ.

In this way, the solid-state imaging device 1-1 is produced.

(Effects of First Embodiment)

In the above-mentioned solid-state imaging device 1-1, the trench element isolation areas 25 formed on the side of the light-receiving surface S of the semiconductor layer 20 are provided to be displaced in a direction that depends on the wavelength of light to be received. Accordingly, the solid-state imaging device 1-1 has a configuration in which a pixel that receives light of a shorter wavelength of in an area in which light of short-wavelength is photoelectrically converted has a larger area, and the volume of the colors 3R, 3G, and 3B is uniform in an area in which light of long-wavelength is photoelectrically converted.

Figure 7A:
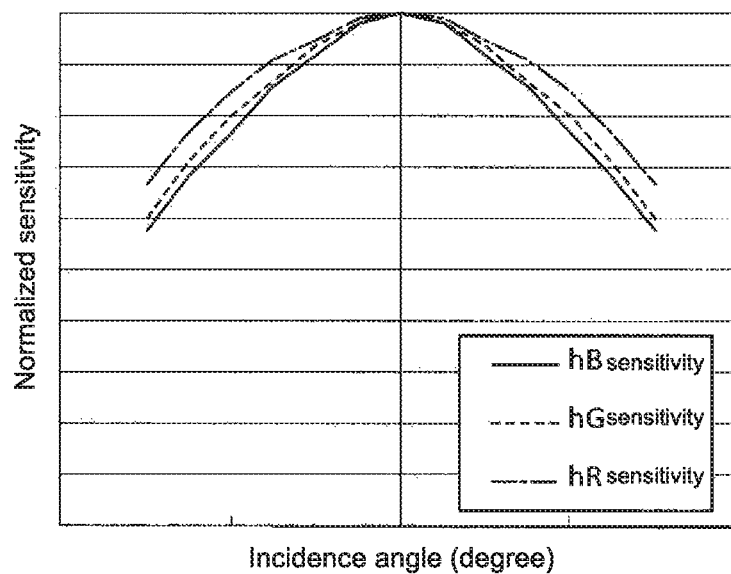
FIGS. 7A-7B are each a graph of normalized sensitivity with respect to an incidence angle.

Therefore, it is possible to prevent the sensitivity of receiving the blue light hB from reducing due to the decrease in the volume on the side of the light-receiving surface S by the trench element isolation areas 25, and to improve the sensitivity shading in the blue pixel 3B. Accordingly, as shown in FIG. 7A, it is possible to cause the normalized sensitivities with respect to an incidence angle of light on the light-receiving surface S to correspond to each other in red light hR, green light hG, and the blue light hB. As a result, the color balance that depends on the sensitivity incidence angle is improved, and it is possible to prevent coloring from occurring.

Figure 7B:
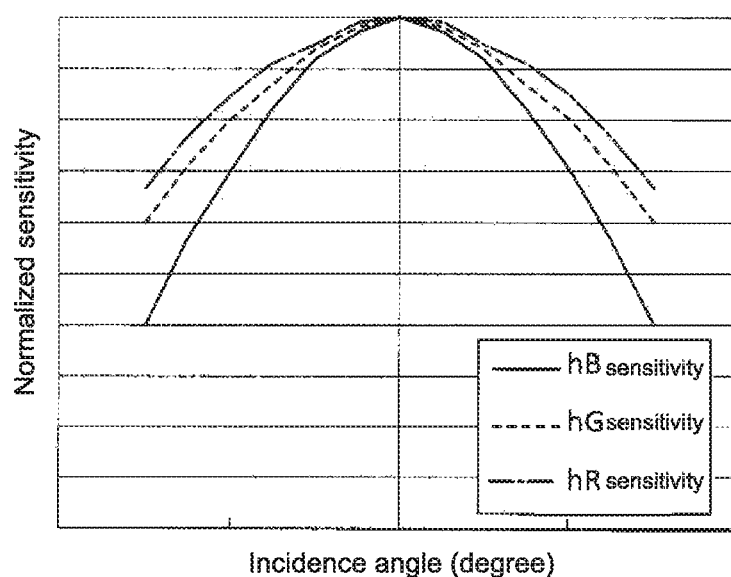

It should be noted that in the existing configuration in which the trench element isolation areas 25 are arranged not to be displaced from the pixel boundary 3a, the sensitivity shading of the blue light hB is larger than those of the red light hR and the green light hG, as shown in FIG. 7B. Therefore, the color balance that depends on the sensitivity incidence angle is collapsed and coloring occurs.

Figure 8A:
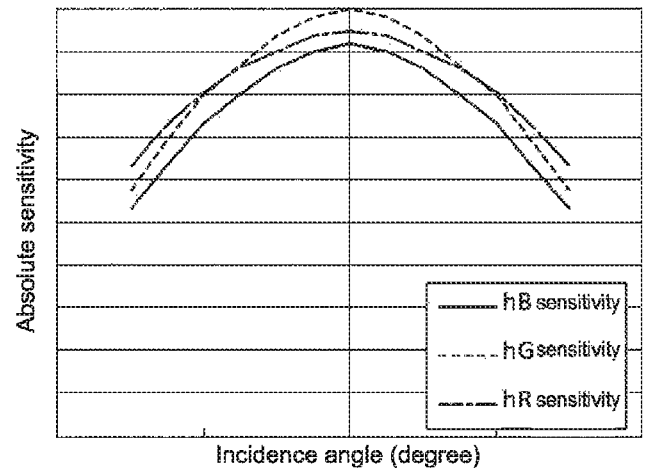
FIGS. 8A-8C are each a graph of absolute sensitivity with respect to an incidence angle.

Moreover, in the configuration of the first embodiment, the light-shielding film 35 is common between the pixels of the colors 3R, 3G, and 3B, and the position of the light-shielding film 35 corresponds to the position of the pixel boundary 3a. Therefore, vignetting of incident light on the light-shielding film 35 is common between the pixels of the colors 3R, 3G, and 3B. Therefore, as shown in FIG. 8A, it is possible to equalize the sensitivity shading without decreasing the absolute sensitivity at the incidence angle of 0°.

Figure 8B:
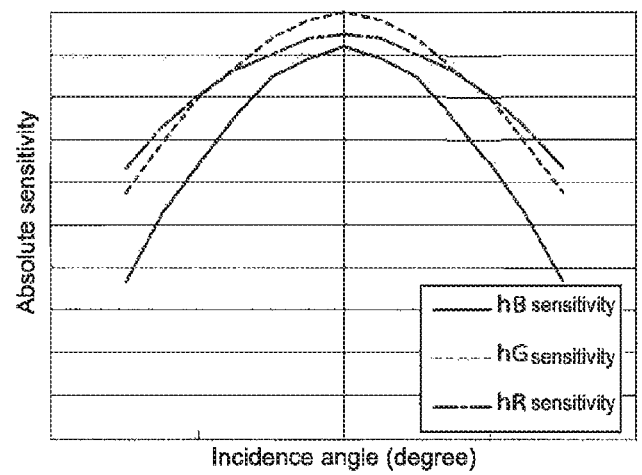
Figure 8C:
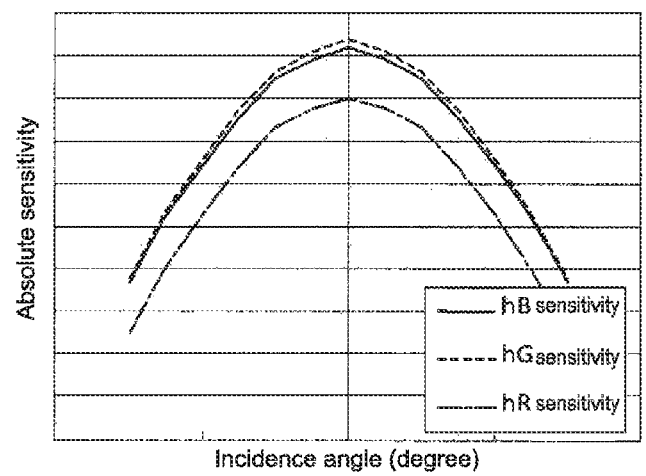

On the other hand, in the existing configuration in which the trench element isolation areas 25 are arranged not to be displaced from the pixel boundary 3a, as shown in FIG. 8B, the sensitivity shading of the blue light hB is significantly large regardless of the absolute sensitivity as compared with those of the red light hR and the green light hG. Moreover, in the configuration in which the light-shielding film 35 is displaced to the side of the pixel of a long-wavelength in order to prevent the sensitivity shading of the blue light hB from occurring, although the color dependency of the sensitivity shading is improved as shown in FIG. 8C, the absolute sensitivity is decreased in the blue pixel 3B of a short-wavelength.

In the configuration of the first embodiment, however, because coloring can be prevented from occurring by improving the color balance depending on the sensitivity incidence angle without decreasing the absolute sensitivity, it is possible to improve the imaging characteristics.

Moreover, in the configuration of the first embodiment, the light-shielding film 35 is arranged in the groove pattern 20a of the trench element isolation area 25. Therefore, light is prevented from leaking from an adjacent pixel 3 via the insulating layer 33 between the light-receiving surface S and the light-shielding film 35. Accordingly, it is also possible to prevent color mixture from occurring.

It should be noted that in the first embodiment, the configuration in which the pixels of the colors 3R, 3G, and 3B are arranged in a Bayer pattern has been described as an example. However, the solid-state imaging device according to an embodiment of the present disclosure is not limited to be applied to such a configuration. For example, in the configuration in which complementary colors of cyan and yellow are used for color filters, the trench element isolation area is provided to be displaced to the side of a pixel of cyan with respect to the pixel boundary 3a between a pixel of cyan and a pixel of yellow. On the other hand, in the configuration in which a pixel of white is used, the trench element isolation area is provided to be displaced to the side of a pixel of white with respect to the pixel boundary 3a between a pixel of the respective colors and the pixel of white. Accordingly, it is possible to obtain the similar effects.

(3. Second Embodiment (Second Example in which Position of Trench Element Isolation Area is Displaced to Side of Pixel of Long-wavelength)
(Configuration of Solid-state Imaging Device 1-2)

Figure 9:
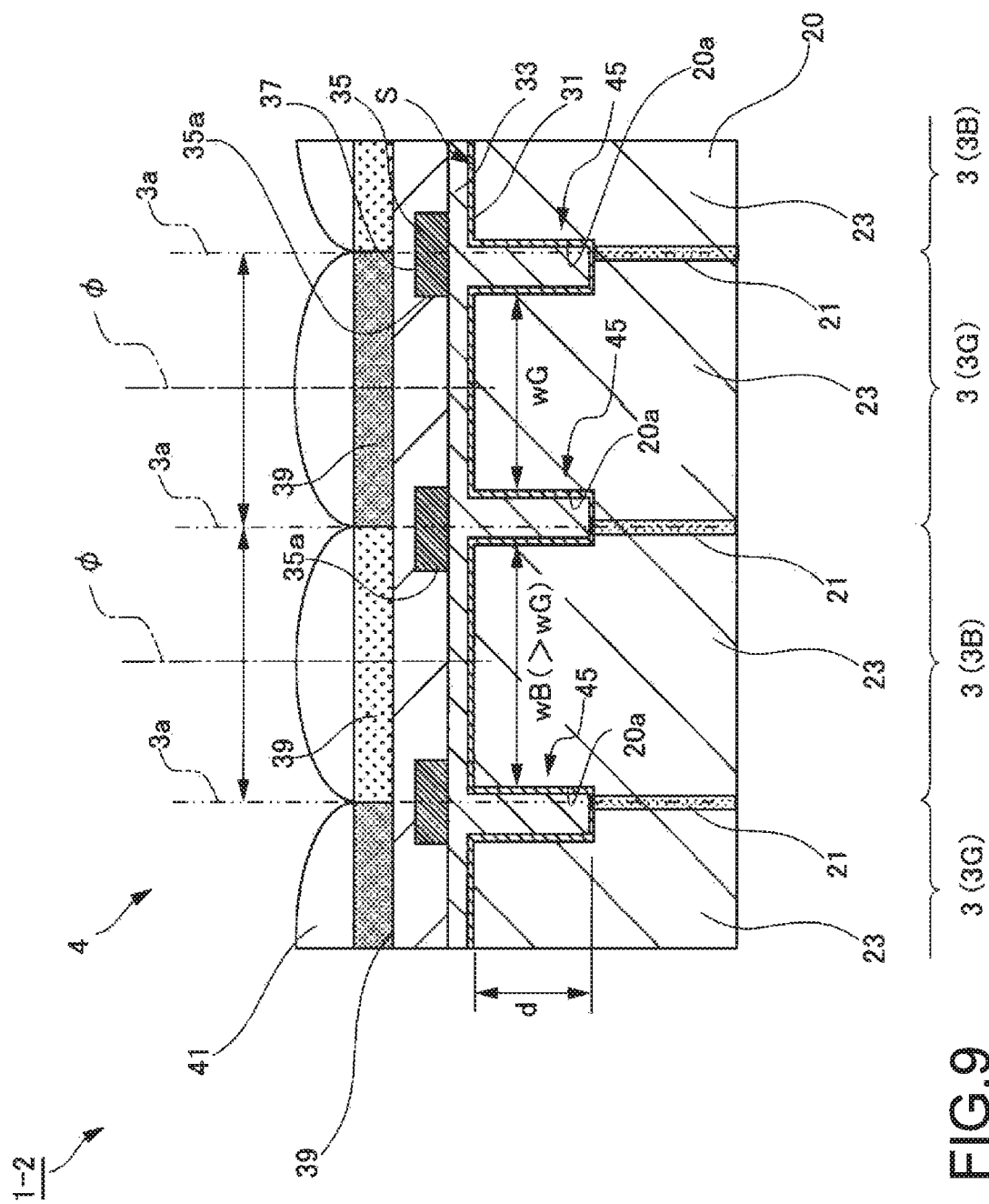
FIG. 9 is a cross-sectional view showing the configuration of a main portion of a solid-state imaging device according to a second embodiment of the present disclosure.

FIG. 9 is a cross-sectional view showing the configuration of a main portion of a solid-state imaging device 1-2 according to a second embodiment of the present disclosure. The solid-state imaging device 1-2 according to the second embodiment shown in FIG. 9 is different from the solid-state imaging device according to the first embodiment in that the light-shielding film 35 is not embedded in a trench element isolation area 45. Other configurations of the solid-state imaging device 1-2 are the same as those of the first embodiment. Therefore, the same component as that of the first embodiment is not described again.

Specifically, the trench element isolation area 45 has a configuration in which the insulating layer 33 is embedded via the protective insulating layer 31 in the groove pattern 20a formed on the side of the light-receiving surface S of the semiconductor layer 20. The arrangement of the groove pattern 20a with respect to the pixel boundary 3a is the same as that of the first embodiment. The configurations of the protective insulating layer 31 and the insulating layer 33 are the same as those of the first embodiment, and the second embodiment is different from the first embodiment in that the protective insulating layer 31 and the insulating layer 33 have film thicknesses that embed the groove pattern 20a. In addition, the light-shielding film 35 is patterned on the insulating layer 33 similarly to the first embodiment, but the second embodiment is different from that first embodiment in that the light-shielding film 35 only has to have a film thickness that is sufficient to block light.

(Method of Producing Solid-state Imaging Device 1-2)

In order to produce the solid-state imaging device 1-2 having such a configuration, the groove pattern 20a may be fully embedded with the protective insulating layer 31 and the insulating layer 33 when the protective insulating layer 31 and the insulating layer 33 that have been described with reference to FIG. 6B are deposited in the production of the solid-state imaging device according to the first embodiment. Other processes may be the same as those of the first embodiment.

(Effects of Second Embodiment)

Also in the solid-state imaging device 1-2 according to the second embodiment having such a configuration, the trench element isolation areas 45, the light-shielding film 35, and the on-chip lenses 41 are arranged with respect to the pixels of the colors 3R, 3G, and 3B similarly to the first embodiment. Therefore, because coloring can be prevented from occurring by improving the color balance depending on the sensitivity incidence angle without decreasing the absolute sensitivity similarly to the first embodiment, it is possible to improve the imaging characteristics.

4. (Third Embodiment (Third Example in which Position of Trench Element Isolation Area is Displaced to Side of Pixel of Long-wavelength))
(Configuration of Solid-state Imaging Device 1-3)

Figure 10:
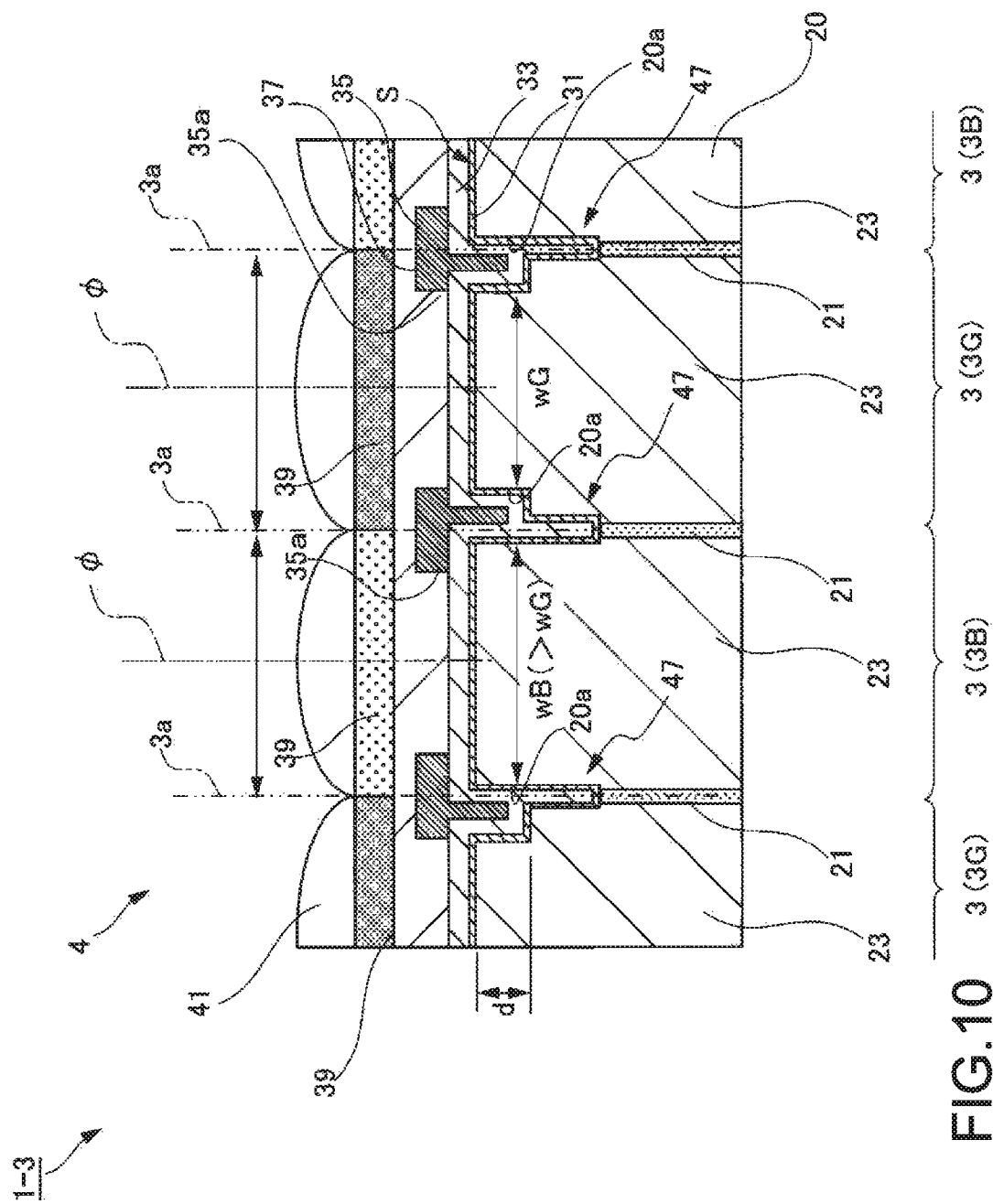
FIG. 10 is a cross-sectional view showing the configuration of a main portion of a solid-state imaging device according to a third embodiment of the present disclosure.

FIG. 10 is a cross-sectional view showing the configuration of a main portion of a solid-state imaging device 1-3 according to a third embodiment of the present disclosure. The solid-state imaging device 1-3 according to the third embodiment shown in FIG. 10 is different from the solid-state imaging device according to the first embodiment in that the pattern width of a trench element isolation area 47 is formed in a stepwise manner in a depth direction. Other configurations of the solid-state imaging device 1-3 are the same as those of the first embodiment. Therefore, the same component as that of the first embodiment is not described again.

Specifically, the trench element isolation area 47 has a two-step pattern width that is wide on the side of the light-receiving surface S and is narrow at a deep position of the semiconductor layer 20. Such a trench element isolation area 47 is provided to be displaced from the pixel boundary 3a at a wide portion of the pattern width on the side of the light-receiving surface S. On the other hand, at a narrow portion of the pattern width distant from the light-receiving surface S in the trench element isolation area 47, the center of the pattern width may correspond to the pixel boundary 3a.

The depth of such a trench element isolation area 47 at a wide portion of the pattern width is set to the depth d described in the first embodiment previously.

In the trench element isolation area 47, the light-shielding film 35 may be embedded only in the wide portion of the pattern width. Accordingly, the trench element isolation area 47 has a configuration in which the light-shielding film 35 can be embedded without generating a void.

(Method of Producing Solid-state Imaging Device 1-3)

In order to produce the solid-state imaging device 1-3 having such a configuration, the groove pattern 20a only has to be formed to have a two-step opening width by an etching process using two masks two times when the groove pattern 20a that has been described with reference to FIG. 6A is formed in the production of the solid-state imaging device according to the first embodiment. Other processes may be the same as those of the first embodiment.

(Effects of Third Embodiment)

Also in the solid-state imaging device 1-3 according to the third embodiment having such a configuration, the trench element isolation areas 47, the light-shielding film 35, and the on-chip lenses 41 are arranged with respect to the pixels of the colors 3R, 3G, and 3B similarly to the first embodiment. Therefore, because coloring can be prevented from occurring by improving the color balance depending on the sensitivity incidence angle without decreasing the absolute sensitivity similarly to the first embodiment, it is possible to improve the imaging characteristics. Moreover, the trench element isolation area 47 has a configuration in which the light-shielding film 35 is arranged in the groove pattern 20a. Therefore, light is prevented from leaking from adjacent pixels 3 similarly to the first embodiment. Accordingly, it is also possible to prevent color mixture from occurring.

5. (Fourth Embodiment( Fourth Example in which Position of Trench Element Isolation Area is Displaced to Side of Pixel of Long-wavelength)
(Configuration of Solid-state Imaging Device 1-4)

Figure 11:
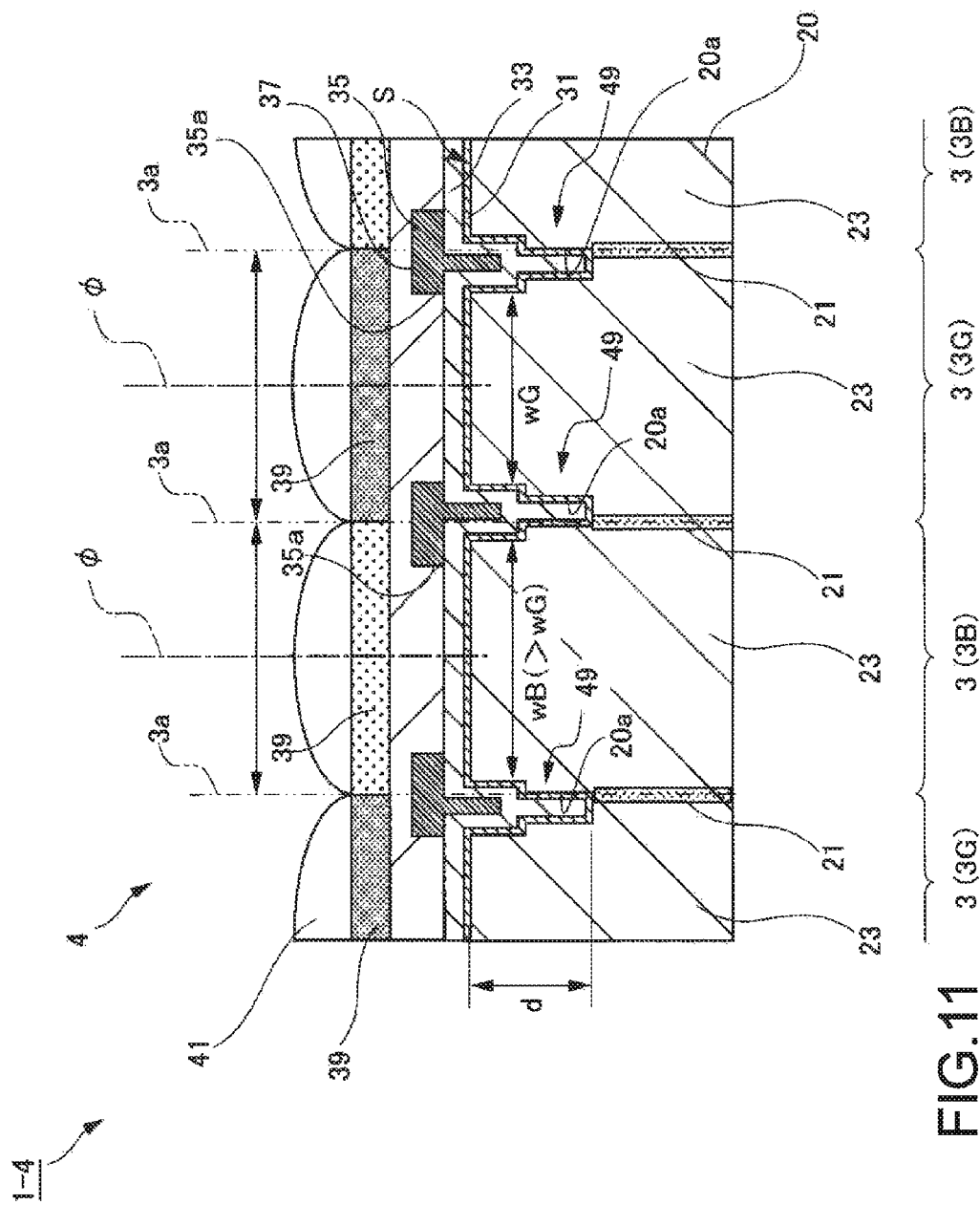
FIG. 11 is a cross-sectional view showing the configuration of a main portion of a solid-state imaging device according to a fourth embodiment of the present disclosure.

FIG. 11 is a cross-sectional view showing the configuration of a main portion of a solid-state imaging device 1-4 according to a fourth embodiment of the present disclosure. The fourth embodiment shown in FIG. 11 is a modified example of the third embodiment. The solid-state imaging device 1-4 is different from the solid-state imaging device according to the first embodiment in that the pattern width of a trench element isolation area 49 is formed in a stepwise manner in a depth direction. Other configurations of the solid-state imaging device 1-4 are the same as those of the first embodiment. Therefore, the same component as that of the first embodiment is not described again.

Specifically, the trench element isolation area 49 has a two-step pattern width that is wide on the side of the light-receiving surface S and is narrow at a deep position of the semiconductor layer 20. Such a trench element isolation area 49 is provided to be displaced from the pixel boundary 3a at a wide portion and a narrow portion of the pattern width on the side of the light-receiving receiving surface S. That is, the groove pattern 20a constituting the trench element isolation area 49 has a shape obtained by digging an opening portion with a narrow width from the bottom center of an opening portion with a wide width formed on the side of the light-receiving surface S.

The entire depth of such a trench element isolation area 49, which includes a wide portion and a narrow portion of the pattern width, is set to the depth d described in the first embodiment previously.

Moreover, in the trench element isolation area 49, the light-shielding film 35 may be embedded only in a wide portion of the pattern width. Accordingly, the trench element isolation area 49 has a configuration in which the light-shielding film 35 can be embedded without generating a void.

(Method of Manufacturing Solid-state Imaging Device 1-4)

In order to produce the solid-state imaging device 1-4 having such a configuration, a portion of the wide opening width of the groove pattern 20a on the side of the light-receiving surface S is formed by an etching process using a mask first when the groove pattern 20a that has been described with reference to FIG. 6A is formed in the production of the solid-state imaging device according to the first embodiment. Next, the groove pattern 20a with a gradually narrowed opening width may be formed by forming side walls on side walls of the groove pattern 20a and further applying an etching process to the bottom center of the groove pattern 20a. Other processes may be the same as those of the first embodiment.

(Effects of Fourth Embodiment)

Also in the solid-state imaging device 1-4 according to the fourth embodiment having such a configuration, the trench element isolation areas 49, the light-shielding film 35, and the on-chip lenses 41 are arranged with respect to the pixels of the colors 3R, 3G, and 3B similarly to the first embodiment. Therefore, because coloring can be prevented from occurring by improving the color balance depending on the sensitivity incidence angle without decreasing the absolute sensitivity similarly to the first embodiment, it is possible to improve the imaging characteristics. Moreover, the trench element isolation area 49 has a configuration in which the light-shielding film 35 is arranged in the groove pattern 20a. Therefore, light is prevented from leaking from adjacent pixels 3 similarly to the first embodiment. Accordingly, it is also possible to prevent color mixture from occurring.

(6. Fifth Embodiment( Example in which Position of Trench Element Isolation Area is Displaced to Side of Pixel of Short-wavelength)

(Configuration of Solid-state Imaging Device 1-5)

Figure 12:
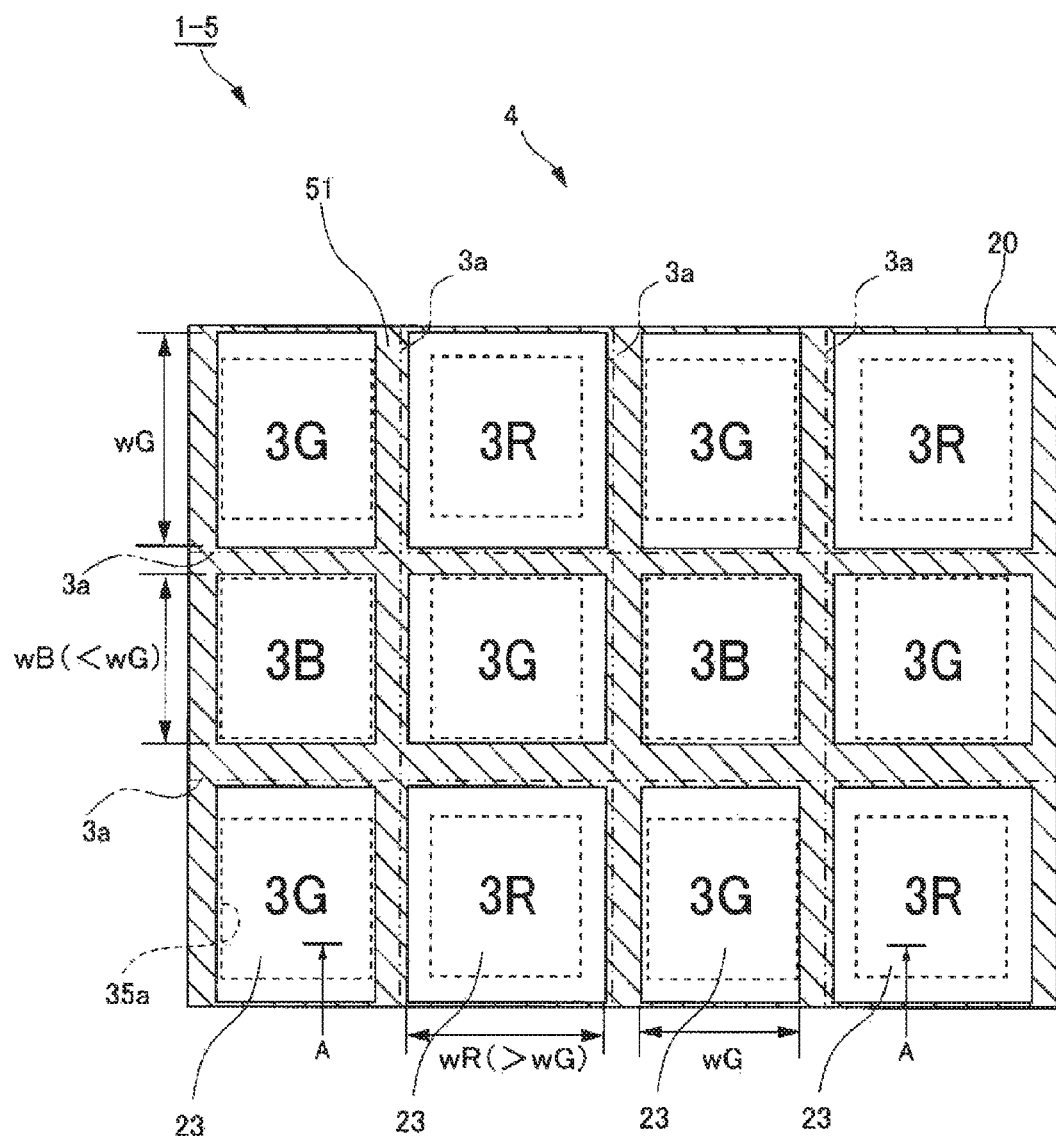
FIG. 12 is a plan view of a main portion of a solid-state imaging device according to a fifth embodiment of the present disclosure.
Figure 13:
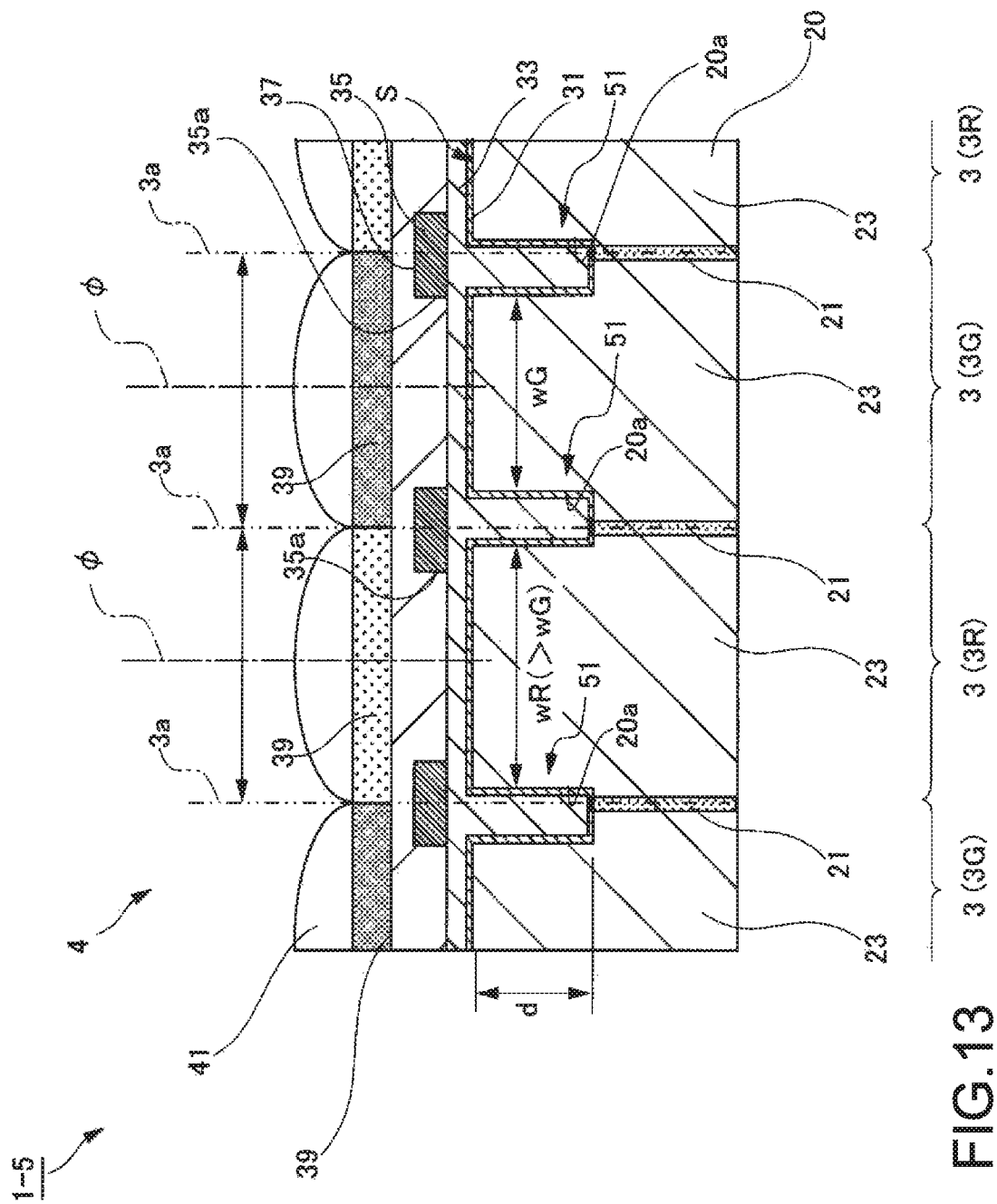
FIG. 13 is a cross-sectional view of a main portion of the solid-state imaging device according to the fifth embodiment, which corresponds to the cross-section taken along the line A-A of FIG. 12.

FIG. 12 is a plan view of a main portion of a solid-state imaging device 1-5 according to a fifth embodiment of the present disclosure, and shows 12 pixels in the case where a semiconductor layer portion of the pixel area 4 is viewed from a light-receiving surface side in a plan view. FIG. 13 is a cross-sectional view of a main portion of the solid-state imaging device 1-5 according to the fifth embodiment, which corresponds to the cross-section taken along the line A-A of FIG. 12. Hereinafter, the configuration of the solid-state imaging device 1-5 according to the fifth embodiment will be described based on FIGS. 12 and 13.

The solid-state imaging device 1-5 according to the fifth embodiment shown in FIGS. 12 and 13 is different from the solid-state imaging device according to the first embodiment in that a trench element isolation area 51 is displaced from the pixel boundary 3a in direction that is different from that of the first embodiment and the light-shielding film 35 is not embedded in the trench element isolation area 51. Other configurations of the solid-state imaging device 1-5 are the same as those of the first embodiment. Therefore, the same component as that of the first embodiment is not described again.

Specifically, the trench element isolation area 51 has a configuration in which the protective insulating layer 31 and the insulating layer 33 are embedded in the groove pattern 20a. The trench element isolation area 51 having such a configuration is provided at a position displaced from the center of the pixel boundary 3a on the light-receiving surface S, and the displacement direction depends on the wavelength of light to be received by two pixels 3 divided by the trench element isolation area 51.

In particular, in the fifth embodiment, the trench element isolation area 51 is provided to be displaced in a direction of one pixel of two pixels 3 arranged adjacent thereto, the one pixel receiving a light of a shorter wavelength. Specifically, in the case of the configuration in which the pixels of the colors 3R, 3G, and 3B are arranged in a Bayer pattern, the trench element isolation area 51 between the green pixel 3G and the red pixel 3R is provided at a position displaced to the side of the green pixel 3G. On the other hand, the trench element isolation area 51 between the green pixel 3G and the blue pixel 3B is provided at a position displaced to the side of the blue pixel 3B.

Here, "the trench element isolation area 51 is provided at a position displaced from the center of the pixel boundary 3a" represents that the center of the width direction when the trench element isolation area 51 is viewed from the side of the light-receiving surface S, i.e., the center of opening width of the groove pattern 20a is displaced from the pixel boundary 3a. Therefore, the trench element isolation area 51 may be arranged on the pixel boundary 3a.

In such a configuration, the width when the trench element isolation area 51 is viewed from the side of the light-receiving surface S, i.e., the opening width of the groove pattern 20a may be constant in the light-receiving surface S.

Accordingly, in the semiconductor layer 20, a pixel that receives light of a short-wavelength is distant from the opening 35a of the light-shielding film 35 in an adjacent pixel, in a depth area in which the trench element isolation area 51 is provided, i.e., a surface area close to the light-receiving surface S. For example, in a direction in which the green pixel 3G and the red pixel 3R are adjacent thereto, the trench element isolation area 51 is arranged to be displaced to the side of the green pixel 3G. Accordingly, the light-receiving surface S of the green pixel 3G is arranged to be distant from the opening 35a of the light-shielding film 35 in the red pixel 3R.

On the other hand, in the semiconductor layer 20, the widths of the photoelectric conversion unit 23 of the pixels of the colors 3R, 3G, and 3B are almost the same in two arrangement directions and the volumes of the photoelectric conversion unit 23 of the pixels of the colors 3R, 3G, and 3B are uniform in a depth direction in which the trench element isolation area 51 is not provided.

(Method of Producing Solid-state Imaging Device 1-5)

In order to produce the solid-state imaging device 1-5 having such a configuration, the position of the groove pattern 20a to be formed is displaced to the side of a pixel that receives light of a short-wavelength range when the groove pattern 20a that has been described with reference to FIG. 6A is formed in the production of the solid-state imaging device according to the first embodiment. Moreover, the groove pattern 20a may be fully embedded with the protective insulating layer 31 and the insulating layer 33 when the protective insulating layer 31 and the insulating layer 33 that have been described with reference to FIG. 6B are deposited. Other processes may be the same as those of the first embodiment.

(Effects of Fifth Embodiment)

In the solid-state imaging device 1-5 according to the fifth embodiment described above, the trench element isolation area 51 formed on the side of the light-receiving surface S of the semiconductor layer 20 is provided to be displaced in a direction that depends on a wavelength of light to be received with respect to the pixel boundary 3a. Accordingly, in an area on the side of the light-receiving surface S in which the trench element isolation area 51 is provided, a pixel that receives light of a short-wavelength is arranged to be distant from the opening 35a of the light-shielding film 35 in an adjacent pixel, and the volumes of the pixels of the colors 3R, 3G, and 3B are uniform in a deeper position.

Figure 14A:
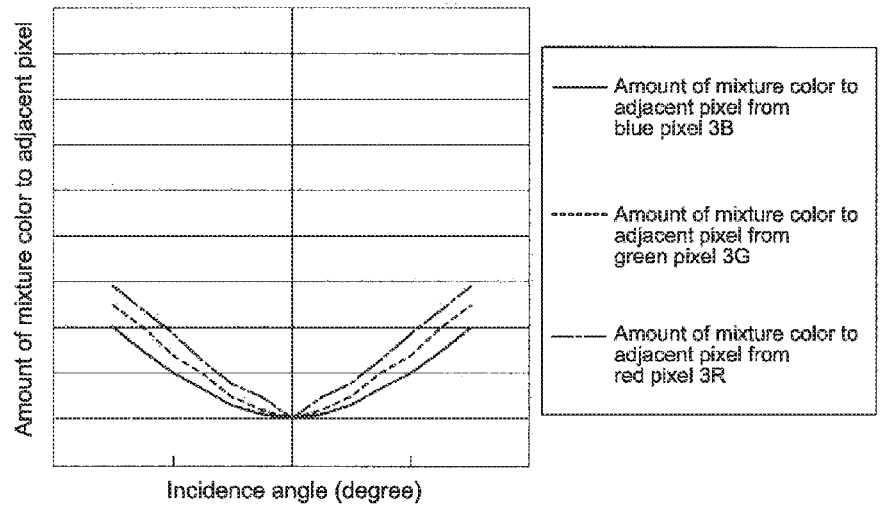
FIGS. 14A-14B are each a graph showing the amount of color mixture to adjacent pixel with respect to an incidence angle.

Therefore, it is possible to prevent leakage of light from occurring by diffraction of the red light hR due to making the photoelectric conversion unit 23 of an adjacent green pixel 3G distant from the opening 35a of the light-shielding film 35 in the red pixel 3R, and the color mixture from generating thereby. Accordingly, as shown in FIG. 14A, it is possible to cause the amounts of color mixture to an adjacent pixel with respect to an incidence angle in the red light hR, the green light hG, and the blue light hB to correspond to each other. As a result, the color balance depending on the sensitivity incidence angle is improved, and it is possible to prevent coloring from occurring.

Figure 14B:
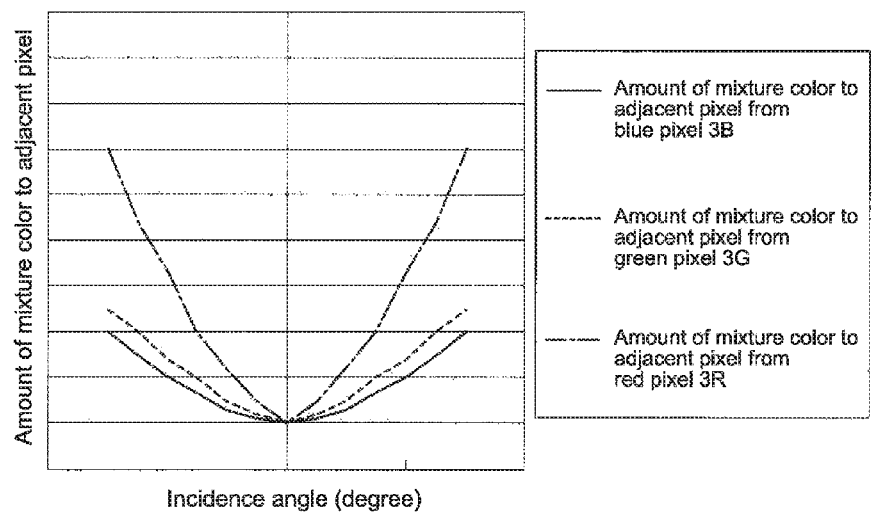

It should be noted that in the existing configuration in which the arrangement of the trench element isolation area is not displaced from a pixel boundary, as shown in FIG. 14B, the amount of leakage to an adjacent pixel in the red light hR is larger than those of the blue light hB and the green light hG. Therefore, the color balance depending on the sensitivity incidence angle is collapsed, and coloring is easy to occur.

In the configuration of the fifth embodiment, the light-shielding film 35 is common between the pixels of the colors 3R, 3G, and 3B, and the position of the light-shielding film 35 corresponds to the position of the pixel boundary 3a. Therefore, vignetting of incident light on the light-shielding film 35 is common between the pixels of the colors 3R, 3G, and 3B, and the absolute sensitivity at the incidence angle of 0° is not decreased.

As a result, according to the solid-state imaging device of the fifth embodiment, because it is possible to prevent color mixture depending on the incidence angle from occurring and to prevent coloring from occurring, the imaging characteristics cam be improved.

(7. Sixth Embodiment( Electronic Apparatus Using Solid-state Imaging Device)

The solid-state imaging device having the respective configurations described in the first embodiment to the fifth embodiment of the present disclosure can be provided to a camera system such as a digital camera and a video camera, a mobile phone having an imaging function, or as a solid-state imaging device for an electronic apparatus such as another device having an imaging function.

Figure 15:
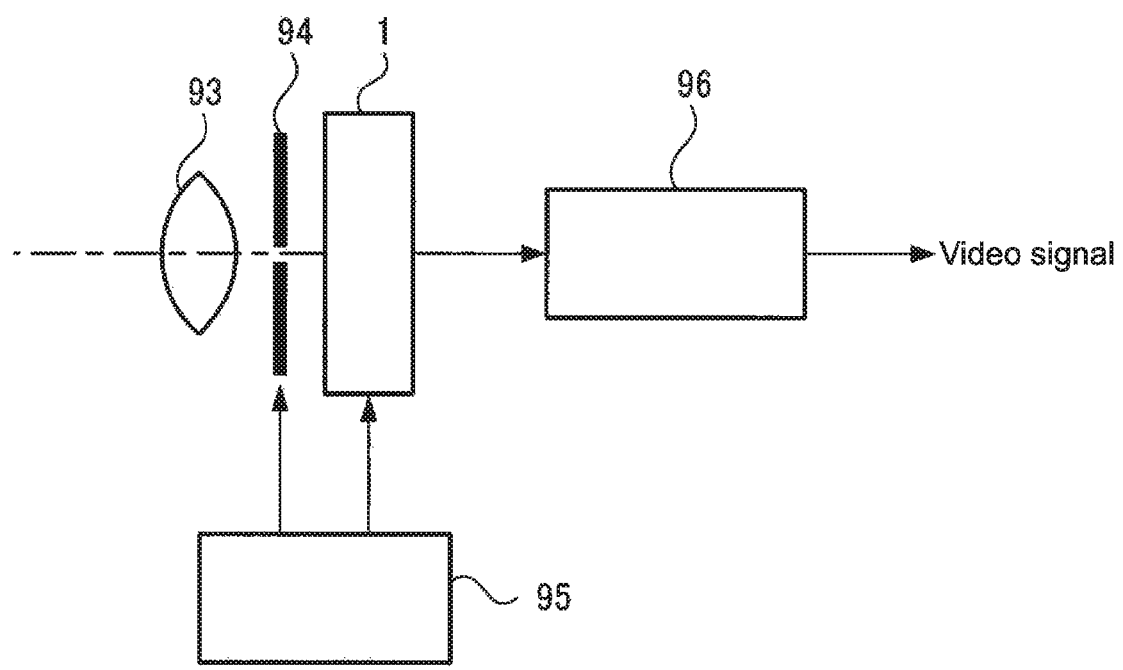
FIG. 15 is a configuration diagram of an electronic apparatus according to a sixth embodiment of the present disclosure, which includes a solid-state imaging element to which an embodiment of the present disclosure is applied.

FIG. 15 is a configuration diagram of a camera using a solid-state imaging device, which serves as an exemplary electronic apparatus according to a six embodiment of the present disclosure. The camera according to this embodiment is, for example, a video camera that is capable of taking still images or videos. A camera 91 includes the solid-state imaging device 1, an optical system 93 that guides incident light into a light receiving sensor unit in the solid-state imaging device 1, a shutter device 94, a drive circuit 95 that drives the solid-state imaging device 1, and a signal processing circuit 96 that processes an output signal of the solid-state imaging device 1.

The solid-state imaging device 1 is a solid-state imaging device having the configuration described in the first embodiment to the fifth embodiment. The optical system (optical lens) 93 causes image light (incident light) of an object to be formed on an imaging surface of the solid-state imaging device 1. On the imaging surface, a plurality of pixels are arranged, and incident light from the optical system 93 is guided to the photoelectric conversion areas of the solid-state imaging device, which constitute the pixels. Accordingly, in the photoelectric conversion areas of the solid-state imaging device 1, signal charges are stored in a certain period of time. Such an optical system 93 may be an optical lens system including a plurality of optical lenses. The shutter device 94 controls the light irradiation period of time and light blocking period of time to the solid-state imaging device 1. The drive circuit 95 supplies a drive signal to the solid-state imaging device 1 and the shutter device 94, and controls the signal output operation of the solid-state imaging device 1 to the signal processing circuit 96 and the shutter operation of the shutter device 94 by the supplied drive signal (timing signal). Specifically, the drive circuit 95 performs an operation of signal transfer from the solid-state imaging device 1 to the signal processing circuit 96 by supplying a drive signal (timing signal). The signal processing circuit 96 performs various signal processes on the signal transferred from the solid-state imaging device 1. The video signal subjected to a signal process is stored in a storing medium such as a memory or is output to a monitor.

According to the electronic apparatus of this embodiment described above, because it includes the solid-state imaging device having favorable imaging properties described in the above-mentioned embodiments, it is possible to capture an image with high precision by an electronic apparatus having an imaging function.

It should be noted that the present disclosure may also take the following configurations.

(1) A solid-state imaging device, including:
a semiconductor layer on which a plurality of pixels are arranged along a light-receiving surface being a main surface of the semiconductor layer;
photoelectric conversion units provided for the respective pixels in the semiconductor layer; and
a trench element isolation area formed by providing an insulating layer in a trench pattern formed on a light-receiving surface side of the semiconductor layer, the trench element isolation area being provided at a position displaced from a pixel boundary between the pixels.

(2) The solid-state imaging device according to (1), in which
the trench element isolation area is displaced from the pixel boundary in a direction that depends on a wavelength of light to be received in the respective pixel.

(3) The solid-state imaging device according to (1) or (2), further including
a light-shielding film provided on an upper side of the light-receiving surface of the semiconductor layer, the light-shielding film having an opening on an upper side of the photoelectric conversion units, the light-shielding film being pattern-formed to have a line width with the pixel boundary being a center.

(4) The solid-state imaging device according to (3), in which the trench element isolation area is covered by the light-shielding film.

(5) The solid-state imaging device according to any one of (1) to (4), further including a color filter of each color provided on an upper side of the light-receiving surface of the semiconductor layer, the color filter being pattern-formed so that a center of the color filter corresponds to a center of the pixel.

(6) The solid-state imaging device according to any one of (1) to (5), further including an on-chip lens provided on an upper side of the light-receiving surface of the semiconductor layer, the on-chip lens being pattern formed so that a center of the on-chip lens corresponds to a center of the pixel.

(7) The solid-state imaging device according to any one of (1) to (6), in which the trench element isolation area is provided to be displaced in a direction of one pixel of the pixels arranged adjacent thereto, the one pixel receiving light of a longer wavelength.

(8) The solid-state imaging device according to (7), in which in a center of the trench pattern of the trench element isolation area, a light-shielding film is embedded.

(9) The solid-state imaging device according to any one of (1) to (8), in which the trench element isolation area is formed to have a line width in a stepwise manner, the line width being increased on a side of the light-receiving surface.

(10) The solid-state imaging device according to (9), in which at least a portion of the trench element isolation area on the side of the light-receiving surface is displaced from the pixel boundary.

(11) The solid-state imaging device according to any one of (1) to (6), in which the trench element isolation area is provided to be displaced in a direction of one pixel of the pixels arranged adjacent thereto, the one pixel receiving light of a shorter wavelength.

(12) The solid-state imaging device according to any one of (1) to (11), in which the semiconductor layer includes a division area including an impurity area on the pixel boundary, the division area extending from a surface opposite to the light-receiving surface to the trench element isolation area.

(13) An electronic apparatus, including:

a semiconductor layer on which a plurality of pixels are set along a light-receiving surface being a main surface of the semiconductor layer;

photoelectric conversion units provided for the respective pixels in the semiconductor layer;

a trench element isolation area formed by providing an insulating layer in a trench pattern formed on a light-receiving surface side of the semiconductor layer, the trench element isolation area being provided at a position displaced from a pixel boundary between the pixels; and an optical system that guides incident light to the photoelectric conversion units.

It should be understood by those skilled in the art that various modifications, combinations, sub-combinations and alterations may occur depending on design requirements and other factors insofar as they are within the scope of the appended claims or the equivalents thereof.

What is claimed is:

1. An imaging device, comprising:
a semiconductor substrate;
a trench region including a first trench, a second trench, and a third trench each disposed in the semiconductor substrate in a cross-section view, wherein the first trench, the second trench, and the third trench are arranged in this order in a first direction in the cross-section view,
a first light-receiving region disposed between the first trench and the second trench, wherein the first light-receiving region is surrounded by the trench region in a plan view; and
a second light-receiving region disposed between the second trench and the third trench, wherein the second light-receiving region is surround by the trench region in the plan view,
wherein a first distance between a center of the first trench and a center of the second trench is different than a second distance between the center of the second trench and a center of the third trench, and
wherein the first distance and the second distance each extend in the first direction.

2. The imaging device according to claim 1, wherein the first trench, the second trench, and the third trench are disposed in a light-incident side in the semiconductor substrate.

3. The imaging device according to claim 1, further comprising a division area disposed between the first light-receiving region and the second light-receiving region in the semiconductor substrate.

4. The imaging device according to claim 3, wherein the division area is disposed at least on a side of the semiconductor substrate that is opposite a light-incident side of the semiconductor substrate the cross-section view.

5. The imaging device according to claim 4, wherein the division area comprises p-type impurities.

6. The imaging device according to claim 4, wherein a center of the second trench is offset from a center of the division area in the first direction in the cross-section view, and wherein the first direction is perpendicular to a depth direction of the semiconductor substrate.

7. The imaging device according to claim 4, wherein the division area is in contact with the second trench.

8. The imaging device according to claim 1, wherein a first photodiode includes the first light-receiving region, and a second photodiode includes the second light-receiving region.

9. The imaging device according to claim 1, wherein a first insulating film is disposed on the semiconductor substrate.

10. The imaging device according to claim 9, wherein the first insulating film is disposed in the first trench.

11. The imaging device according to claim 1, wherein a light-shielding unit is disposed on the semiconductor substrate.

12. The imaging device according to claim 11, wherein the light-shielding unit is disposed in the first trench, the second trench, and the third trench.

13. The imaging device according to claim 1,
wherein a first on-chip lens and a first color filter are disposed at a light-incident side of the semiconductor substrate between the first trench and the second trench in the cross-section view,
wherein a second on-chip lens and a second color filter are disposed at the light-incident side of the semiconductor substrate between the second trench and the third trench in the cross-section view, and wherein the first color filter filters light of a different wavelength range than the second color filter.

14. The imaging device according to claim 8, further comprising a second insulating film disposed on the first insulating film.

15. The imaging device according to claim 14, wherein the second insulating film is disposed in the first trench.

16. The imaging device according to claim 9, wherein the first insulating film includes an oxide comprising at least one of hafnium, aluminum, tantalum, and titanium.

17. The imaging device according to claim 14, wherein the second insulating film is silicon oxide or silicon nitride.

18. An imaging device, comprising:
a semiconductor substrate having a first side as a light-receiving side;
a trench region disposed in the semiconductor substrate at the first side;
a first color filter corresponding to a first color disposed at the first side of the semiconductor substrate,
a second color filter corresponding to a second color disposed at the first side of the semiconductor substrate,
a first region of the semiconductor substrate comprising at least a portion of a first photodiode, wherein the first region is surrounded by the trench region at the first side in a plan view and aligned with the first color filter in a depth direction of the semiconductor substrate;
a second region of the semiconductor substrate comprising at least a portion of a second photodiode, wherein the second region is surrounded by the trench region at the first side in the plan view and aligned with the second color filter in the depth direction of the semiconductor substrate;
wherein a first area of the first region in a plan view at the first side is larger than a second area of the second region in the plan view at the first side, and
wherein the first color filter filters light of a different wavelength range than the second color filter.

19. The imaging device according to claim 18, wherein the trench region surrounds the first region in a first rectangular shape at the first side in the plan view, and the trench region surrounds the second region in a second rectangular shape at the first side in the plan view.

20. The imaging device according to claim 19, wherein a first side of the first rectangular shape is a same length as a first side of the second rectangular shape in the plan view, and a second side of the first rectangular shape is a different length than a second side of the second rectangular shape in the plan view.

21. The imaging device according to claim 19, wherein a side of the first rectangular shape is a same length as a side of the second rectangular shape in the plan view, and a first area of the first rectangular shape is larger than a second area of the second rectangular shape in the plan view.

22. The imaging device according to claim 19,
wherein a first side of the first rectangular shape is a different length than a first side of the second rectangular shape in the plan view,
and
wherein the first rectangular shape and the second rectangular shape are each approximately a square shape.

23. The imaging device according to claim 18, further comprising a division area disposed between the first region and the second region in the semiconductor substrate.

24. The imaging device according to claim 23, wherein the division area is disposed at least on a side of the semiconductor substrate that is opposite to the light-receiving side of the semiconductor substrate in the cross-section view.

25. The imaging device according to claim 24, wherein the division area comprises p-type impurities.

26. The imaging device according to claim 24, wherein the division area is in contact with the trench region.

27. The imaging device according to claim 18, wherein a first insulating film is disposed on the semiconductor substrate, and a second insulating film is disposed on the first insulating film.

28. The imaging device according to claim 27, wherein the first insulating film and the second insulating film are disposed in the trench region.

29. The imaging device according to claim 18, wherein a light-shielding unit is disposed on the semiconductor substrate.

30. The imaging device according to claim 18,
wherein a first on-chip lens is disposed at a light-receiving side of the first color filter in the cross-section view, and
wherein a second on-chip lens is disposed at a light-receiving side of the second color filter in the cross-section view.

* * * * *